(12) United States Patent
Levitt et al.

(10) Patent No.: US 7,474,095 B2
(45) Date of Patent: Jan. 6, 2009

(54) NMR SPECTROSCOPY USING SPIN STATES WITH LONG LIFETIMES

(75) Inventors: Malcolm Harris Levitt, Southampton (GB); Marina Carravetta, Southampton (GB); Ole Gustav Johannessen, Southampton (GB); Walter Köckenberger, Nottingham (GB)

(73) Assignee: University of Southampton, Southampton (GB)

( * ) Notice: Subject to any disclaimer, the term of this patent is extended or adjusted under 35 U.S.C. 154(b) by 242 days.

(21) Appl. No.: 10/566,640

(22) PCT Filed: Jul. 8, 2004

(86) PCT No.: PCT/GB2004/002966

§ 371 (c)(1),
(2), (4) Date: Nov. 6, 2006

(87) PCT Pub. No.: WO2005/015253

PCT Pub. Date: Feb. 17, 2005

(65) Prior Publication Data

US 2007/0063700 A1    Mar. 22, 2007

(30) Foreign Application Priority Data

Jul. 28, 2003   (GB) ................... 0317600.5
Dec. 22, 2003   (GB) ................... 0329692.8

(51) Int. Cl.
*G01V 3/00* (2006.01)
(52) U.S. Cl. ...................... 324/300; 324/307
(58) Field of Classification Search ................ 324/300, 324/307, 309, 312
See application file for complete search history.

(56) References Cited

U.S. PATENT DOCUMENTS 5,917,322 A    6/1999   Gershenfeld et al.

(Continued)

FOREIGN PATENT DOCUMENTS

EP    0 239 724 A3    10/1987
WO    03/081526 A1    10/2003

OTHER PUBLICATIONS

D. Sakellariou et al., "Experimental Observation of Periodic Quasi-Equilibia In Solid-State NMR," Chemical Physics Letters 308 (1999) 381-389.

(Continued)

*Primary Examiner*—Louis M Arana
(74) *Attorney, Agent, or Firm*—Wong, Cabello, Lutsch, Rutherford & Brucculeri, LLP

(57) ABSTRACT

A nuclear magnetic resonance method and apparatus are disclosed. A sample is provided where the nuclear spin Hamiltonian operator of the component molecules of the sample possess one or more symmetry operations. A quasi equilibrium nuclear spin ensemble state in a sample is created. The quasi equilibrium nuclear spin ensemble state includes at least two manifolds of spin states which transform differently under the symmetry operations of the Hamiltonian and the manifolds having different mean nuclear spin populations. The quasi equilibrium nuclear spin ensemble state is allowed to remain for a time of equal to or substantially greater than $3T_1$, where $T_1$ is the spin lattice relaxation time. The symmetry operation of the Hamiltonian is broken. A sequence of magnetic fields is applied to generate a nuclear magnetic resonance signal from the sample. The nuclear magnetic resonance signal is detected.

28 Claims, 14 Drawing Sheets

U.S. PATENT DOCUMENTS

| | | | |
|---|---|---|---|
| 6,218,832 B1 | 4/2001 | Chuang et al. | |
| 6,537,847 B2* | 3/2003 | Zagoskin et al. | 438/105 |
| 7,015,499 B1* | 3/2006 | Zagoskin | 257/31 |
| 7,188,033 B2* | 3/2007 | Mills | 702/22 |
| 2004/0078421 A1* | 4/2004 | Routt | 709/201 |

OTHER PUBLICATIONS

D. Sakellariou et al., "Quasi Equilibria in Solid-State NMR," Chemical Physics Letters 293 (1998) 110-118.

D. G. Cory et al., "Nuclear Magnetic Resonance Spectroscopy: An Experimentally Accessible Paradigm for Quantum Computing," Physica D 120 (1998) 82-101.

E. M. Fortunato et al., "Implementation of Universal Control on a Decoherence-Free Qubit," New Journal of Physics 4 (2002) 5.1-5.20.

D. P. Weitekamp et al., "Zero-Field Nuclear Magnetic Resonance," The American Physical Society (1983) 1807-1810.

R. McDermott et al., "Liquid-State NMR and Scalar Couplings in Microtesla Magnetic Fields," Science vol. 295 (2002) 2247-2249C.

K. Golman et al., "Parahydrogen-Induced Polarization in Imaging: Subsecond 13C Angiography," Magnetic Resonance in Medicine 46:1-5 (2001).

P.G. Kwait et al., "Experimental Verification of Decoherence-Free Subspaces," Sciene vol. 290 (2000) 498-501.

M. G. Pravica et al., "Net NMR Alignment by Adiabatic Transport of Parahydrogen Addition Products to High Magnetic Field," Chemical Physics Letters (1988) 255-258.

C. R. Bowers et al., "Parahydrogen and Synthesis Allow Dramatically Enhanced Nuclear Alignment," J. Am. Chem. Soc. (1987) 5541-5542.

N. A. Gershenfeld et al., "Bulk Spin-Resonance Quantum Computation," Science vol. 275 (1997) 350-356.

J. E. Ollerenshaw et al., "A Magnetic Resonance Realization of Decoherence-Free Quantum Computation," arXiv:quant-ph/0302157 v2 Sep. 24, 2003.

D. A. Lidar et al., "Decoherence-Free Subspaces and Subsystems," arXiv:quant-ph/0301032 v1 Jan. 9, 2003.

E. M. Fortunato et al., "Exploring Noiseless Subsystems via Nuclear Magnetic Resonance," arXiv:quant-ph/0210057 v1 Oct. 9 2002.

L. Viola et al., "Experimental Realization of Noiseless Subsystems for Quantum Information Processing," Science vol. 293 (2001) 2059-2063.

* cited by examiner (a)

Light Flash 701

(b)

NMR SPECTROSCOPY USING SPIN STATES WITH LONG LIFETIMES

CROSS-REFERENCE TO RELATED APPLICATIONS

This application is a National Stage of PCT/GB2004/002966, entitled "NMR Spectroscopy Using Spin States with Long Lifetimes" and having an international filing date of 8 Jul. 2004, to which priority is claimed and which claims priority to GB0317600.5 (28 Jul. 2003) and GB0329692.8 (22 Dec. 2003).

FIELD OF INVENTION

The present invention relates to the field of Nuclear magnetic resonance (NMR). More specifically, the present invention relates to a method of Nuclear magnetic resonance (NMR) spectroscopy which utilises non-equilibrium spin states with long lifetimes.

BACKGROUND OF INVENTION

Nuclear magnetic resonance (NMR) is a powerful and well established tool for studying samples and sample interactions. It can also be used for imaging, for example, Magnetic Resonance Imaging (MRI).

In NMR, the spin and magnetism of atomic nuclei are exploited to provide information about the chemical composition, spatial distribution, or molecular motion of the molecules or atoms.

One of the limitations of NMR is the low intrinsic signal strength. Attempts to address this problem have included nuclear spin hyperpolarization experiments, for example using parahydrogen (C. R. Bowers and D. P. Weitekamp, Phys. Rev. Lett. 57, 2645-2648 (1986); C. R. Bowers and D. P. Weitekamp, J. Am. Chem. Soc. 109, 5541-5542 (1987); M. G. Pravica and D. P. Weitekamp, Chem. Phys. Lett. 145, 255-258 (1988)).

One of the principal factors contributing to the applicability of NMR based techniques is the relatively long lifetime of the nuclear spin order. This long lifetime allows NMR to be used to follow processes such as diffusion, flow, slow molecular motion and chemical reactions. The relaxation of the nuclear spins back to thermal equilibrium, and hence the lifetime of the nuclear spin memory is characterised by a time constant, $T_1$ known as the longitudinal relaxation time constant or as the spin lattice relaxation time constant. The time constant $T_1$ is governed by molecular motion, and is in general different from the phase memory time $T_2$, which depends upon molecular motion and also external perturbations such as magnetic field gradients. In general, $T_1$ is always longer than $0.5\ T_2$, although in common situations, $T_1$ is much greater than $T_2$, often by an order of magnitude.

Generally, for many samples, the time constant $T_1$ is of the order of seconds. Thus, the time for following a process of the type mentioned above is very limited.

Attempts have been made to extend the phase memory time in the context of quantum computation, using the concept of Decoherence-Free Subspaces (L. Viola, E. M. Fortunato, M. A. Pravia, E. Knill, R. Laflamme and D. G. Cory, Science 293, 2059-2063 (2001); E. M. Fortunato, L. Viola, M. A. Pravia, E. Knill, R. Laflamme, T. F. Havel and D. G. Cory, quant-ph/0210057 (2002); D. A. Lidar and K. B. Whaley, quant-ph/0301032 (2003); J. E. Ollerenshaw, D. A. Lidar and L. E. Kay, quant-ph/0302175 (2003)). However, although the compensation of artificial noise contributions to the phase memory time $T_2$ has been demonstrated, the extension of the spin memory time beyond $T_1$ has not been demonstrated.

SUMMARY OF INVENTION

The present inventors have found that it is possible to generate nuclear spin states which remain far from equilibrium for a time much longer than $T_1$. These spin states may be advantageously used to study processes with a longer lifetime than that of $T_1$. These non-equilibrium spin states may be studied (and in some cases, created) by switching the symmetry of the nuclear spin Hamiltonian operator.

Thus, in a first aspect, the present invention provides an NMR method, the method comprising: providing a sample where the nuclear spin Hamiltonian operator of the component molecules of the sample possess one or more symmetry operations; creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations; allowing said quasi equilibrium nuclear spin ensemble state to remain for a time of equal to or substantially greater than $3T_1$, where $T_1$ is the spin lattice relaxation time; breaking at least one of the said symmetry operations of said Hamiltonian; applying a sequence of magnetic fields to generate a nuclear magnetic resonance signal from said sample; and detecting said nuclear magnetic resonance signal.

The term symmetry is used here to describe an exchange operation of one or more of the nuclear spins that leaves the nuclear spin Hamiltonian invariant. In practice, the imposition of a new symmetry operation does not need to be exact. This is discussed in more detail later. It will be appreciated by those skilled in the art that the said Hamiltonian is the effective Hamiltonian of the nuclear spins, which governs the evolution of the nuclear magnetic moments over the relevant part of the applied experimental sequence.

Manifold is the term used in the art for groups of nuclear spin states that transform in a common way under the symmetry operations of the nuclear spin Hamiltonian. The manifolds may reach internal equilibrium independently and may have different mean nuclear spin populations. A state of internal equilibrium for the individual manifolds but different mean nuclear spin populations for different manifolds is, by definition, not a thermal equilibrium state for the entire ensemble of nuclear spins. Nevertheless, it may be very long lived, since there are no relaxation processes internal to the molecules which can lead to its destruction, hence it is referred to as a quasi equilibrium nuclear spin ensemble state.

For the avoidance of doubt and as used herein, the term quasi equilibrium nuclear spin ensemble state will be used to mean a state of the spin ensemble in which manifolds of different symmetry have reached internal equilibrium but in which the different manifolds are not equilibrated with each other.

An example of a quasi-equilibrium spin state is found in an ensemble of molecules each containing two spins-½ of the same isotopic type, in a magnetic field which is sufficiently low that the chemical shift differences between the nuclei may be ignored. In this case, an exchange of the two nuclear spins is as a symmetry operation of the nuclear spin Hamiltonian operator. The nuclear spin states may be classified as symmetric with respect to this operation (the three triplet states) or as antisymmetric with respect to this operation (the singlet state). A state of the ensemble of molecules, in which the populations of the triplet states have equilibrated with each other, but in which the singlet population is different from the mean triplet population, qualifies as a "quasi-equilibrium nuclear spin state".

Another example is found in a sample composed of molecules of the form A—$CH_2$—$CH_2$—X, where A and X are arbitrary groups, supposed to have no significant nuclear spin magnetism. In low magnetic field, an exchange of the spins in the two $CH_2$ groups with respect to each other is a symmetry operation of the nuclear spin Hamiltonian operator. The nuclear spin states may be classified as symmetric, or anti-symmetric, with respect to this spin exchange operation. A state of the ensemble of molecules, in which the populations of the symmetric states have equilibrated with each other, and in which the populations of the antisymmetric states have equilibrated with each other, but in which the mean symmetric state population is different from the mean antisymmetric state population, qualifies as a "quasi-equilibrium nuclear spin ensemble state".

A non-equilibrium singlet population is a special case of a quasi-equilibrium spin state, which applies when the molecules only contain two nuclei with significant magnetic properties. Quasi-equilibrium nuclear spin ensemble states apply to molecules with two or more coupled nuclear spins. The present invention may be used with a sample which can form a non-equilibrium singlet population or with a sample which can form a quasi-equilibrium spin ensemble state other than a non-equilibrium singlet population.

In a second aspect, the present invention provides an NMR method, the method comprising: providing a sample where the nuclear spin Hamiltonian operator of the component molecules of the sample possess one or more symmetry operations; creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population; breaking the symmetry operation of said Hamiltonian; applying a sequence of magnetic fields to generate a nuclear magnetic resonance signal from said sample; and detecting said nuclear magnetic resonance signal.

In the method of the second aspect of the present invention, the quasi-equilibrium nuclear spin ensemble state lasts for a time of at least $3T_1$ Thus, the method may further comprises allowing said quasi equilibrium nuclear spin ensemble state to remain for a time of equal to or greater than $3T_1$, where $T_1$ is the spin lattice relaxation time before breaking at least one symmetry operation of said Hamiltonian;

In any of the above aspects of the present invention, a sample is prepared which has a Hamiltonian possessing one or more symmetry operations, this state can exist for a time of at least $3T_1$ before one or more of the symmetry operations is removed from the Hamiltonian.

A number of different methods may be used to impose and remove a symmetry operation for the nuclear spin Hamiltonian operator and some of these are dependent on the nature of the sample.

When the molecules of the sample comprise nuclear spins of different isotopic types or have different chemical shifts and the molecules have sufficient geometrical symmetry said step of providing a sample where the nuclear spin Hamiltonian operator of the component molecules of the sample possess one or more symmetry operations may comprise reducing a magnetic field to a value where a symmetry operation is imposed on said Hamiltonian. A molecule of sufficient geometrical symmetry is defined as a molecule for which the spin Hamiltonian, including all direct and indirect spin-spin couplings, has higher symmetry when the chemical shifts are ignored than when the chemical shifts are present.

Alternatively, the sample could be kept in high field while a radiofrequency pulse sequence is applied which has the effect of suppressing the chemical shift differences, see for example J. D. Ellett and J. S. Waugh, J. Chem. Phys. 51, 2851 (1969); M. H. Levitt, R. Freeman and T. A. Frenkiel, Adv. Magn. Reson. 11, 47 (1983).

Alternatively, a sample may be subjected to a chemical reaction, configured to switch the molecules between different conformational or configurational states, in which spin symmetry operations are imposed in order to provide a sample where the nuclear spin Hamiltonian operator of the component molecules of the sample possess one or more symmetry operations. An example of such a chemical reaction is a photoisomerization reaction. Such a reaction may be used to change a molecule from a mixed cis-trans form to a pure cis or pure trans form.

A number of different methods may be employed for creating the quasi-equilibrium nuclear spin ensemble state. For example, the sample may be subjected to radiofrequency pulses of magnetic field in a high magnetic field environment. Specifically, thermal equilibration of a sample in high magnetic field, perturbation of the equilibrium of the nuclear spin system using applied radiofrequency pulses, and transport of the sample into the low magnetic field.

Those skilled in the art are aware of the technique of manipulating the populations of spin states using timed sequences of pulsed radiofrequency fields, resonant with the precession frequency of the nuclei in the high static magnetic field. The sequence of pulsed fields may be configured to produce a non-equilbrium state in high field, which gives rise to a quasi-equilibrium configuration of spin state populations, once the sample is transported to low magnetic field.

The quasi-equilibrium nuclear spin ensemble state may also be provided by reacting an unsaturated symmetric molecule with parahydrogen.

Alternatively, the quasi-equilibrium nuclear spin ensemble state may also be provided by reacting an unsaturated non-symmetric molecule with parahydrogen, the product of said reaction being placed in a magnetic field which is sufficiently low such that the difference in chemical shifts be ignored.

Providing a sample with the desired symmetry and creating a quasi-equilibrium nuclear spin ensemble state, may be performed as distinct steps in sequence or otherwise, or may be performed together, for example by manipulating the populations of the spin states of a molecule such that a quasi-equilibrium spin state is formed once a symmetry operation is provided to the Hamiltonian.

Since there are no relaxation processes internal to the molecule which can convert the quasi-equilibrium nuclear spin ensemble state to a fully equilibrated ensemble state, the lifetime of the quasi-equilibrium nuclear spin ensemble state can be much longer than the conventional relaxation time $T_1$. For this reason, such states may be used a long-term repository of nuclear spin order. For example, the inventors found that, in systems of inequivalent spin pairs in low magnetic field, the decay of the singlet state population, or other quasi-equilibrium nuclear spin ensemble state, is governed by a time constant which is much longer than the spin relaxation time $T_1$ This long lifetime allows nuclear spin order to persist during processes which take longer than $T_1$.

Thus, while said quasi-equilibrium nuclear spin ensemble state is maintained, the sample may flow through an apparatus or a body, may be reacted with a second sample, may be purified or placed in contact with a second sample, in order to allow a transfer of nuclear spin order. The quasi-equilibrium nuclear spin ensemble state is preferably maintained for at least $5T_1$, more preferably at least $10T_1$.

The quasi-equilibrium nuclear spin ensemble state may be observed by (i) breaking the symmetry operation of the molecular spin Hamiltonian followed by (ii) a sequence of events leading to the generation of an informative NMR signal.

The operations leading to the breaking of symmetry are the same as those discussed above in the context of the making of symmetry. For example, in systems displaying chemical inequivalence, the symmetry may be broken by imposing a sufficiently large external magnetic field. In other cases, the symmetry may be broken by photoisomerization processes or other chemical reactions.

Applying a sequence of magnetic fields to generate an NMR signal from said sample may be performed in either a high static magnetic field background or a low static magnetic field background. A low field is considered to be a field which is equal to or less than 20 mT.

The condition for a low field is that the difference in the precession frequencies of the involved spins must be equal to, or smaller than the J-couplings. In the case of two protons, with a chemical shift difference of 10 ppm and a J-coupling of 1 Hz (roughly worst case), this condition implies that the field should be less than around 2 mT, which is easy to achieve, even without magnetic shielding. If the chemical shift difference is smaller, or if the J-coupling is larger, larger magnetic fields may be tolerated, in direct proportion to the J-coupling, and in inverse proportion to the chemical shift difference. The heteronuclear case is more difficult; for example, for a system of protons and carbon-13 nuclei, with a J-coupling of 120 Hz, the external field must be less than 3 µT, which requires careful magnetic shielding. A high field condition as used herein is when the difference in the precession frequencies of the involved spins is larger than the J-couplings.

The NMR signal may be detected in the standard way using electromagnetic induction within a coil. Alternatively, a direct magnetic field detecting device such as Superconducting Quantum Inteference Device "SQUID" may be used (see for example R. McDermott, A. H. Trabesinger, M. Mück, E. L. Hahn, A. Pines and J. Clarke, Science 295, 2247-2249 (2002)).

In a third aspect, the present invention provides an NMR apparatus, the apparatus comprising: means for providing a sample where the nuclear spin Hamiltonian operator of the component molecules of the sample possess one or more symmetry operations; means for creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population; means for breaking the symmetry operation of said Hamiltonian; means for applying a sequence of magnetic fields to generate a nuclear magnetic resonance signal from said sample; and means for detecting said nuclear magnetic resonance signal.

The means for providing a sample where the nuclear spin Hamiltonian operator of the component molecules of the sample possess one or more symmetry operations may be provided by a chemical or physical environment configured to produce the desired sample. For example, a means may be provided to perform any of the above suggested methods for providing such a sample.

Similarly, means for creating a a quasi equilibrium nuclear spin ensemble state in said sample may be a means for allowing performance of any of the above described methods for creating the a quasi equilibrium nuclear spin ensemble state.

Although the above discussion has concentrated on an NMR method, the creation of a quasi equilibrium nuclear spin ensemble state may be used for other applications, for example for storing information in the form of quantum bits or "qubits".

Thus, in a fourth aspect, the present invention provides a method of storing information, said method comprising: providing a sample where the nuclear spin Hamiltonian operator of the component molecules of the sample possess one or more symmetry operations; and creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations; assigning a bit value to at least one spin state of said quasi equilibrium nuclear spin ensemble state and storing said spin state for a time equal to or substantially greater than $3T_1$, where $T_1$ is the spin lattice relaxation time.

In a fifth aspect, the present invention provides a method of storing information, said method comprising: providing a sample where the nuclear spin Hamiltonian operator of the component molecules of the sample possess one or more symmetry operations; and creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population; assigning a bit value to at least one spin state of said quasi equilibrium nuclear spin ensemble state and storing said spin state for a time equal to or substantially greater than $3T_1$, where $T_1$ is the spin lattice relaxation time.

The preferred methods discussed above in relation to NMR for providing the sample and creating the quasi equilibrium nuclear spin ensemble state may also be used with the above fourth and fifth aspects of the invention.

The above methods may be used to store qubits in quantum computing or related applications. Previously, NMR techniques have been suggested for quantum computation by: D. G. Cory, A. F. Fahmy and T. F. Havel, Proc. Natl. Acad. Sci. USA 94, 1634-1639 (1997); N. A. Gershenfeld and I. L. Chuang, Science 275, 350-356 (1997). The techniques covered in these papers may be combined with the present invention.

In a sixth aspect, the present invention provides an apparatus for storing information, said apparatus comprising: means for providing a sample where the nuclear spin Hamiltonian operator of the component molecules of the sample possess one or more symmetry operations; and means for creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations; means for assigning a bit value to at least one spin state of said quasi equilibrium nuclear spin ensemble state and storing said spin state for a time equal to or substantially greater than $3T_1$, where $T_1$ is the spin lattice relaxation time.

In a seventh aspect, the present invention provides an apparatus for storing information, said apparatus comprising: means for providing a sample where the nuclear spin Hamiltonian operator of the component molecules of the sample possess one or more symmetry operations; and means for creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population; means for assigning a bit value to at least one spin state of said quasi equilibrium nuclear spin ensemble state.

BRIEF DESCRIPTION OF THE DRAWINGS

The present invention will now be described with reference to the following preferred non-limiting embodiments in which:

FIG. 5a is a conventional $^1$H NMR spectrum of the solution of 2,3-dibromothiophene (inset) in DMSO-d$^6$;

FIG. 5b is a spectrum generated by the method of FIGS. 3 and 4a;

FIG. 5c is a spectrum generated by the method of FIGS. 3 and 4a, using a different pulse sequence to t used to produce the spectrum of FIG. 5b;

FIGS. 7a through 7e are plots of singlet population against time for a number of different magnetic fields which are to be used as the low field, wherein FIG. 7a is for a low field of 0 T, FIG. 7b is for a low field 20 mT, FIG. 7c is for a low field of 200 mT, FIG. 7d is for a low field of 500 mT, FIG. 7e is for a low field of 1 T and FIG. 7f is for a field of 5 T.

DETAILED DESCRIPTION OF THE INVENTION

Figure 1:
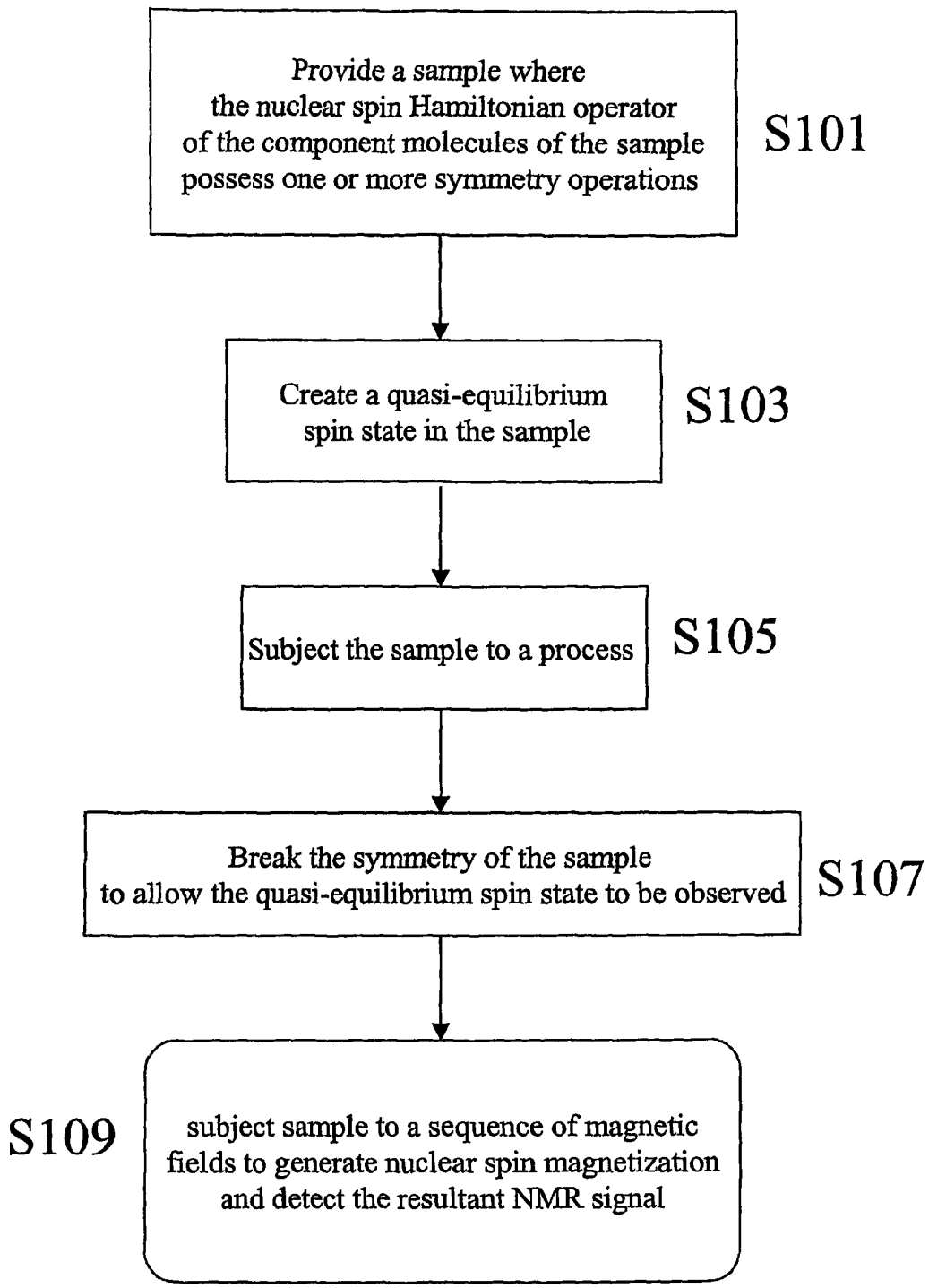
FIG. 1 is a flow diagram outlining a method in accordance with an embodiment of the present invention.

FIG. 1 outlines the basic steps in accordance with an embodiment of the present invention.

Figure 13:
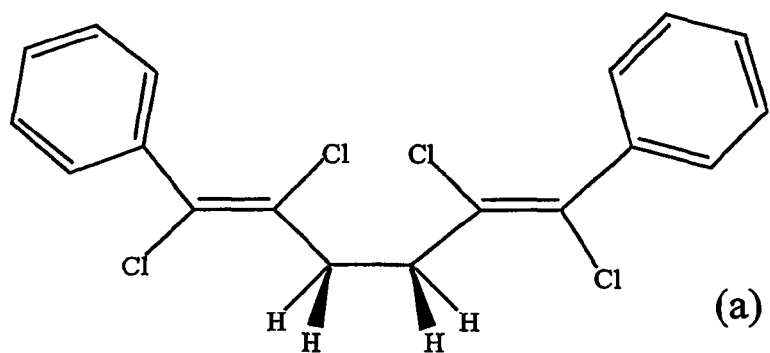
FIGS. 13a and 13b schematically illustrate a photoisomerization process which may be used to impose or remove a symmetry operation on a Hamiltonian.
Figure 13:
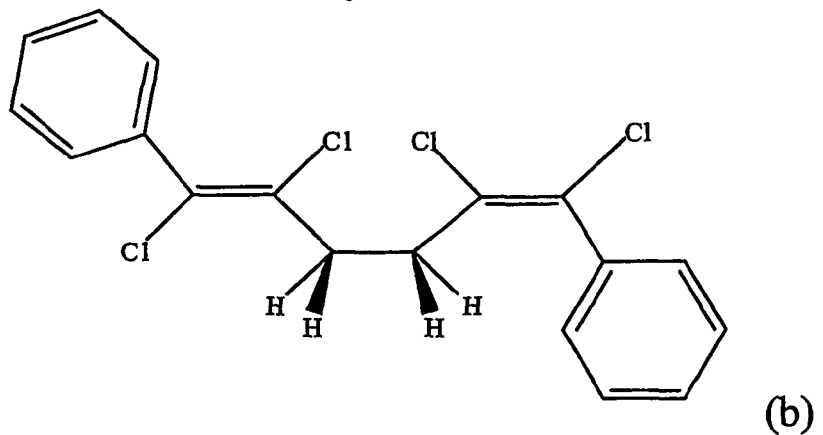

In step S101, a sample is provided where the nuclear spin Hamiltonian operator of the component molecules of the sample possess one or more symmetry operations. This step may involve providing a sample which has this quality inherently (such a method will be described in more detail with reference to FIG. 8), alternatively, the sample may only possess this quality in certain environments (this will be described with reference to FIGS. 3, 10 and 14), as a further option, the sample may need to be chemically modified to achieve the symmetry requirement (this will be described with reference to FIG. 13).

In Step S103, a quasi-equilibrium nuclear spin ensemble state is created, how this state may be created will be described later with reference to FIGS. 3 to 14. The term quasi equilibrium nuclear spin ensemble state is used to refer to the state of a spin ensemble in which manifolds of different symmetry have reached internal equilibrium but in which the different manifolds are not equilibrated with each other.

Once the quasi equilibrium nuclear spin ensemble state has been created, it may be stored for a reasonably long time, much longer the spin-lattice relaxation time $T_1$. $T_1$ is believed to be the time constant which determines when the spin memory is quenched in NMR experiments. However, the inventors have found that the quenching of quasi equilibrium nuclear spin ensemble states is governed by a time constant $T_{qe}$ which is much greater than $T_1$. This allows the sample to undergo processes S105 before the quasi equilibrium nuclear spin ensemble state decays and for a time greater than or equal to $3T_1$. For example, the sample may be injected or inserted into a human or animal body and its passage through the body may then be studied using NMR. Since the sample may be allowed to propagate in the body for longer than conventionally allowed due to the discovery of the long lifetime of the quasi equilibrium nuclear spin ensemble state, more information may be gathered and different types of experiments may be conducted utilising the long lifetime of the quasi equilibrium nuclear spin ensemble state.

The extension of spin memory lifetimes beyond $T_1$ by using quasi-equilibrium states is distinct from the extension of spin dephasing lifetimes beyond $T_2$ demonstrated in the context of Decoherence-Free Subspaces as employed in quantum computation (L. Viola, E. M. Fortunato, M. A. Pravia, E. Knill, R. Laflamme and D. G. Cory, Science 293, 2059-2063 (2001); E. M. Fortunato, L. Viola, M. A. Pravia, E. Knill, R. Laflamme, T. F. Havel and D. G. Cory, quant-ph/0210057 (2002); D. A. Lidar and K. B. Whaley, quant-ph/0301032 (2003); J. E. Ollerenshaw, D. A. Lidar and L. E. Kay, quant-ph/0302175 (2003)). The main distinctions are: (i) the major $T_1$ mechanism is usually the modulation of the dipole-dipole coupling by random molecular motion, while the experiments reported in the quantum computation field demonstrate the compensation of an artificial shortening of $T_2$ by molecular diffusion in strong magnetic field gradients; (ii) the methods reported in the above references are incapable of demonstrating a lengthening of the spin memory time beyond $T_1$.

The sample may be reacted with other samples or may undergo a purification process during step S105. Alternatively, the sample may be placed in physical contact with other molecules to transfer polarisation of the quasi equilibrium nuclear spin ensemble state. The quasi equilibrium nuclear spin ensemble state may only be observed if the symmetry of the sample is broken S107. This may be done by a number of methods which will be described with reference to FIGS. 2 to 13.

The sample is then subjected to a sequence of magnetic fields to generate nuclear spin magnetization. The sequence of magnetic fields may be applied in a high magnetic field environment as described in detail with reference to FIG. 4, or a low or zero magnetic field environment as described in R. McDermott, A. H. Trabesinger, M. Mück, E. L. Hahn, A. Pines and J. Clarke, Science 295, 2247-2249 (2002).

The signal from the NMR active sample can then be detected using either a high field detection technique such as electromagnetic induction of current in a coil or direct detection of the magnetisation using a SQUID or the like.

Figure 2:
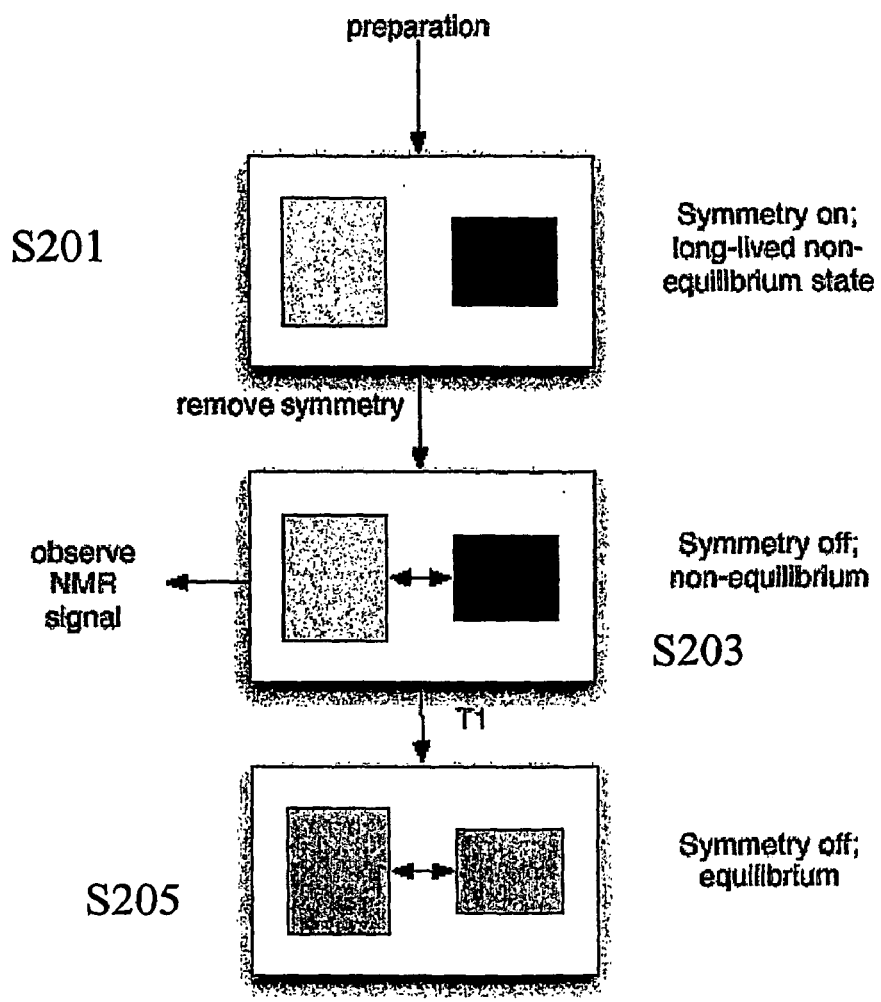
FIG. 2 is a flow diagram to illustrate the switching of symmetry operations in the Hamiltonian.

FIG. 2 schematically illustrates the symmetry considerations for steps S103 to S109 of FIG. 1. The small rectangles represent two different state manifolds, and the shading represents their populations. In S201, the quasi equilibrium nuclear spin ensemble state has been prepared and the sample has a Hamiltonian which has one or more symmetry operations. In this environment, the quasi equilibrium nuclear spin ensemble state decays with a long time constant $T_{qe}$, which is much longer than the spin lattice relaxation time $T_1$.

In step 203, the symmetry operations are removed from the Hamiltonian, allowing the NMR signal to be observed. Due to spin-lattice relaxation, the spin population between the states equilibrates and an equilibrium state is reached after $T_1$ in step S205.

Figure 3:
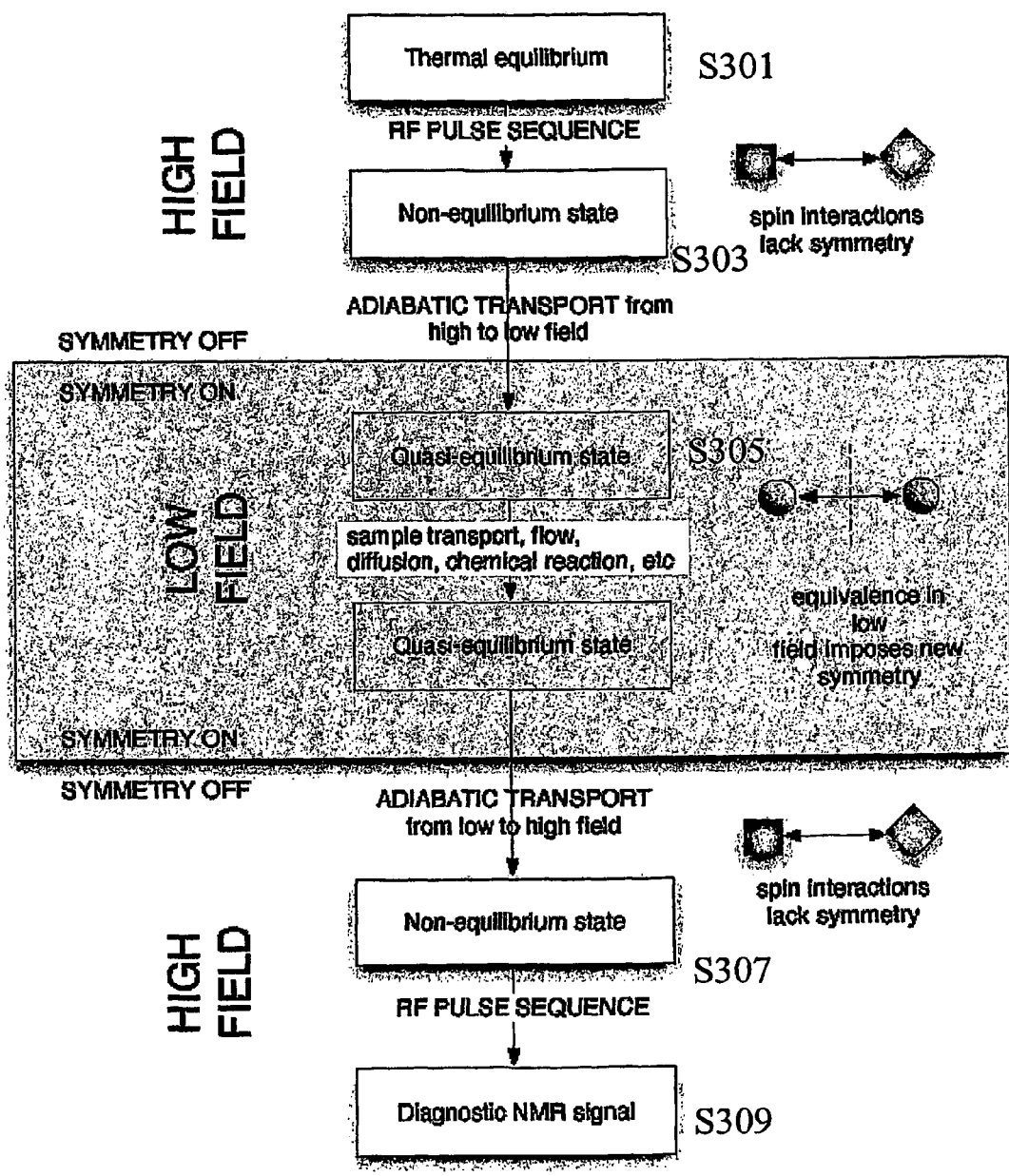
FIG. 3 is a flow diagram illustrating a method in accordance with an embodiment of the present invention.
Figure 4:
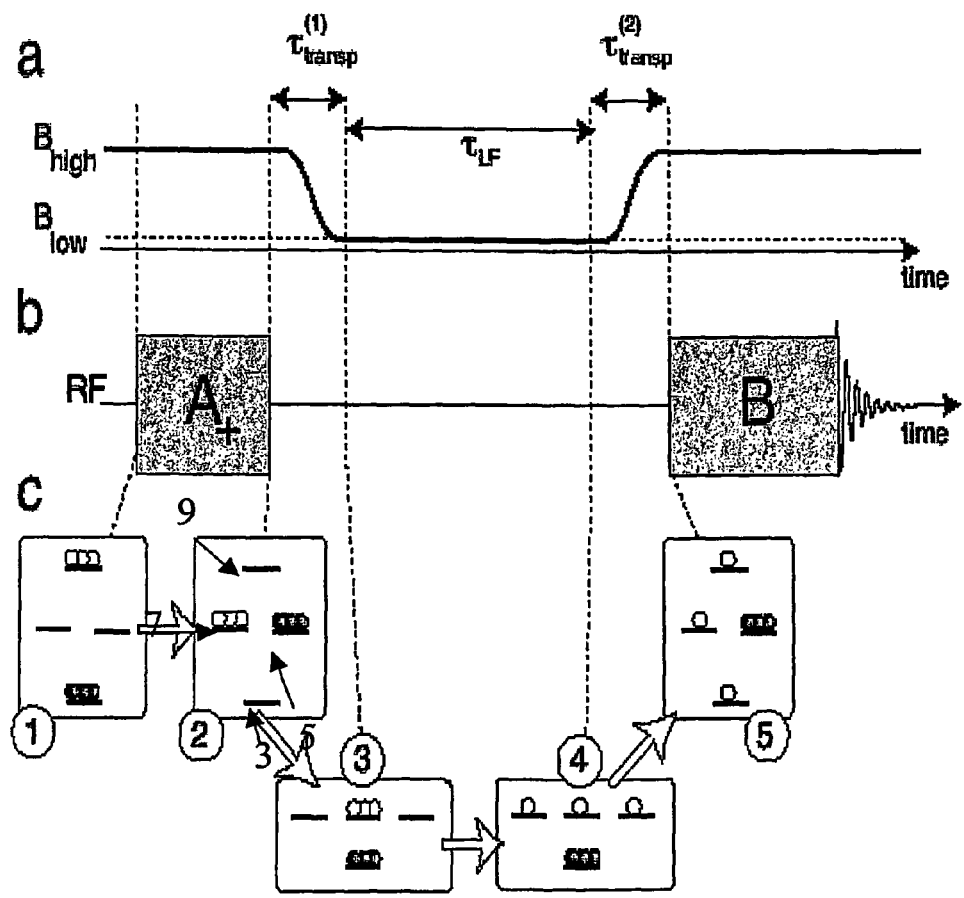
FIG. 4a is a schematic plot of B-field applied to the sample against times
FIG. 4b is a schematic plot of radiofrequency magnetic pulse sequences applied perpendicular to the sample against time.
FIG. 4c is a schematic plot of the distribution of spin state populations of a sample subjected to the static fields of FIG. 4a and the pulse sequences of FIG. 4b.

FIG. 3 and FIG. 4 schematically illustrate a method in accordance with an embodiment of the present invention. FIG. 3 is a flow diagram summarising the processes, while FIGS. 4a, 4b and 4c describe the changes to the sample and its environment.

In NMR procedures, a sample is subjected to a high constant magnetic field $B_{high}$. A much smaller rf pulsed magnetic field is then provided perpendicular to the high magnetic field $B_{high}$.

The pulsed magnetic field follows a pulse sequence $A_+$. The pulse sequence is applied at the Larmor frequency of the spins in the high magnetic field. The pulse sequence will be described in greater detail later in the description. It is well known to those skilled in the art of NMR how to design pulse sequences in order to achieve a desired distribution of spin states within a sample. For the purposes of symmetry-breaking, the high magnetic field simply needs to be an order of magnitude larger than the "low" field discussed above, i.e. more than a few mT for typical proton systems, and more than a few nT for heteronuclear systems. However, for the purposes of sensitive observation of the NMR signals, the field will usually be as large as possible, i.e. between 1 and 20 Tesla, depending upon the instrument available.

FIG. 4c schematically illustrates how the spin states may be manipulated using pulse sequence $A_+$.

At time point 1, the nuclear spin system has four Zeeman energy levels with energies in the order $E_{\alpha\alpha}$ (3)<$E_{\alpha\beta}$ (5)<$E_{\beta\alpha}$ (7)<$E_{\beta\beta}$ (9). In the figure, $E_{\alpha\beta}$ (5) and $E_{\beta\alpha}$ (7) are shown to be virtually identical. However, there is a slight energy difference between these two levels. The above assumes that the chemical shift $\delta_2$ is greater than the chemical shift $\delta_1$, the gyromagnetic ratio $\gamma$ and the J-coupling are both positive and that the spin system is weakly-coupled in high fields. The population is distributed throughout the four states. In thermal equilibrium at ambient temperature, the lower most level $|\alpha\alpha\rangle$ has a small excess population (depicted by the filled balls), while the uppermost level $|\beta\beta\rangle$ has a slightly depleted population (depicted by the white balls). These population differences are very small in the case of conventional thermal polarisation, but may be of the order of one in spin hyperpolarization experiments. The sample is in thermal equilibrium and this stage of the sample corresponds to step S301 in FIG. 4.

The pulse sequence $A_+$ is then applied until time point 2, taking the sample to step S303 in FIG. 4. During this time, the population of state $|\alpha\alpha\rangle$ exchanges with that of $|\alpha\beta\rangle$, and that of $|\beta\alpha\rangle$ with that of $|\beta\beta\rangle$. Thus, a non-equilibrium population distribution is generated, in which level $|\alpha\beta\rangle$ has an excess population, while $|\beta\alpha\rangle$ has a depleted population. This is shown at time point 2.

During the interval $\tau_{transp}^{(1)}$ from time point 2 to time point 3, the sample is transported to a region of low magnetic field $B_{low}$, which is of the order of milliTesla, taking the sample to S305 of FIG. 4. Typically, $B_{low}$ will be at most 20 mT. In low field, it is convenient to discuss the behaviour of the nuclear spins using the four eigenstates of the pure J-coupling Hamiltonian [1].

$$H_J = 2\pi J I_1 \cdot I_2 \qquad [1]$$

The four J-coupling eigenstates may be classified as the three components of a triplet state, plus a singlet state. The triplet state components are denoted by equation [2].

$$|T_1\rangle = |\alpha\alpha\rangle \qquad [2]$$
$$|T_0\rangle = \frac{1}{\sqrt{2}}(|\alpha\beta\rangle + |\beta\alpha\rangle)$$
$$|T_{-1}\rangle = |\beta\beta\rangle$$

The triplet states have the same J-coupling eigenvalue of $$+\frac{1}{2}\pi J.$$

The singlet state is denoted by equation [3].

$$|S_0\rangle = \frac{1}{\sqrt{2}}(|\alpha\beta\rangle - |\beta\alpha\rangle) \qquad [3]$$

The singlet state has a J-coupling eigenvalue of $$-\frac{3}{2}\pi J.$$

The triplet and singlet states are energy eigenstates of the nuclear spins only if the magnetic field is zero. The energy level diagram in this case is depicted next to time point 3 in FIG. 4c. Although we use the zero-field eigenstates as a basis for a representation of the spin density operator, the treatment below does not assume a field of exactly zero.

If the transport from high to low field is fast compared to $T_1$ but slow compared to the J-coupling, the excess population of the high-field eigenstate $|\alpha\beta\rangle$ is transferred adiabatically into an excess population of the low-field eigenstate $|S_0\rangle$. Similarly, the depleted population of the high-field eigenstate $|\beta\alpha\rangle$ is transferred adiabatically into a depleted population of the zero-field eigenstate $|T_0\rangle$. The idealized distribution of the singlet and triplet state populations is shown at time point 3 in FIG. 4c. This assumes pure adiabatic transfer and neglects $T_1$ relaxation during the transport interval.

The nuclear spins evolve in low magnetic field under a combination of coherent and incoherent relaxation processes. Here we use a standard second-order perturbation treatment of the modulate dipole-dipole interaction to analyze the spin-lattice relaxation in low field.

In general, the spin density operator p evolves according to the Liouville-von Neumann equation [4].

$$\frac{d}{dt}\rho(t) = \hat{L}_{LF}\rho(t) \qquad [4]$$

Where the low-field Liouvillian is given by equation [5].

$$\hat{L}_{LF} = \hat{\Gamma}_{LF} - i\hat{H}_{LF} \qquad [5]$$

$\hat{H}_{LF}$ is the superoperator for the commutator with the low-field spin Hamiltonian of equation [6].

$$H_{LF} = \gamma B_{LOW}(1+\delta_1)I_{1Z} - \gamma B_{LOW}(1+\delta_2)I_{2Z} + H_J \qquad [6]$$

The thermal polarization terms may be ignored in low field. If the relaxation is dominated by the intramolecular dipole-dipole coupling mechanism, the relaxation superoperator may be evaluated by second-order time-dependent perturbation theory and is given by equation [7].

$$\hat{\Gamma}_{LF} \cong -\int_{-\infty}^{0} \overline{\hat{H}_{DD}(-\tau)\hat{H}_{DD}(0)} d\tau \qquad [7]$$

$\hat{H}_{DD}$ (t) is the commutation superoperator for the dipole-dipole coupling Hamiltonian, evaluated at time t, and the overbar represents an ensemble average. Equation [4] is general for any field strength low enough to satisfy the extreme narrowing condition for the dipole-dipole relaxation.

It is convenient to us the matrix representations of the Liouvillian superoperator $\hat{L}_{LF}$ in a space of orthonormal spin operators. The following set of six operators generate a suitable basis:

$$|1\rangle = |S_0\rangle\langle S_0| = \frac{1}{2}(I_1^\alpha I_2^\beta + I_1^\beta I_2^\alpha - I_1^+ I_2^- - I_1^- I_2^+)$$

$$|2\rangle = |T_1\rangle\langle T_1| = I_1^\alpha I_2^\alpha$$

$$|3\rangle = |T_0\rangle\langle T_0| = \frac{1}{2}(I_1^\alpha I_2^\beta + I_1^\beta I_2^\alpha + I_1^+ I_2^- + I_1^- I_2^+)$$

$$|4\rangle = |T_{-1}\rangle\langle T_{-1}| = I_1^\beta I_2^\beta$$

$$|5\rangle = \frac{1}{2}(|S_0\rangle\langle T_0| + |T_0\rangle\langle S_0|) = \frac{1}{\sqrt{2}}(I_1^\alpha I_2^\beta - I_1^\beta I_2^\alpha)$$

$$|6\rangle = \frac{1}{2i}(|S_0\rangle\langle T_0| - |T_0\rangle\langle S_0|) = -i\frac{1}{\sqrt{2}}(I_1^+ I_2^- - I_1^- I_2^+)$$

where $I_j^\pm$ are single-spin shift operators and $\{I_j^\alpha, I_j^\beta\}$ are single-spin polarization operators. The ket $|1\rangle$ describes the population operators of the singlet state. Kets $|2\rangle$, $|3\rangle$ and $|4\rangle$ describe the population operators of the three triplet states. Kets $|5\rangle$ and $|6\rangle$ represent the x and y-components of the coherence between the singlet state and the central component of the triplet. All of these operators commute with the angular momentum operator along the field axis, as does the low-field Hamiltonian $H_{LF}$. The operator basis of equation [8] is closed under the application of the low-field Liouvillian $\hat{L}_{LF}$. The matrix representation of the low-field relaxation superoperator $\hat{\Gamma}_{LF}$ may be evaluated by standard relaxation theory, assuming pure intramolecular dipole-dipole relaxation driven by rigid isotropic random rotation with a correlation time $\tau_c$. The low-field Liouvillian evaluates to $$\hat{L}_{LF} = \qquad [8]$$

$$\begin{pmatrix} 0 & 0 & 0 & 0 & 0 & -2^{\frac{1}{2}}\omega_\Delta^{low} \\ 0 & -\frac{9}{10}b^2\tau_c & \frac{3}{10}b^2\tau_c & \frac{3}{5}b^2\tau_c & 0 & 0 \\ 0 & \frac{3}{10}b^2\tau_c & -\frac{3}{5}b^2\tau_c & \frac{3}{10}b^2\tau_c & 0 & 2^{\frac{1}{2}}\omega_\Delta^{low} \\ 0 & \frac{3}{5}b^2\tau_c & \frac{3}{10}b^2\tau_c & -\frac{9}{10}b^2\tau_c & 0 & 0 \\ 0 & 0 & 0 & 0 & -\frac{1}{2}b^2\tau_c & 2\pi J \\ 2^{\frac{1}{2}}\omega_\Delta^{low} & 0 & -2^{\frac{1}{2}}\omega_\Delta^{low} & 0 & -2\pi J & -\frac{1}{2}b^2\tau_c \end{pmatrix}$$

where the dipole-dipole coupling between the spins is given by $b = -(\mu_0/4\pi)\gamma^2\hbar r^{-3}$, and r is the internuclear distance. The low-field chemical shift frequency difference is defined by equation [9].

$$\omega_\Delta^{low} = -\gamma B_{low}(\delta_2 - \delta_1) \qquad [9]$$

In zero field $\omega_{\Delta low} = 0$, the first row and column of equation [8] contains only zeros. This indicates that the singlet state population is dynamically isolated in low field, and is conserved under the evolution process. The zero-field singlet state may be used as a long-term repository for nuclear spin order, protected from intramolecular dipole-dipole relaxation.

If the magnetic field is not exactly zero, equation [8] indicates that the singlet state is relaxed indirectly by dynamic couplings to the central triplet state and to singlet-triplet coherence.

The idealized behaviour of the spin ensemble after an interval $\tau_{LF}$ in low field is depicted by the diagram at time point 4 in FIG. 4c. If the field is sufficiently low, and $\tau_{LF}$ is long enough, the triplet populations equilibrate, while the singlet population is conserved. Thus, a quasi-equilibrium ensemble spin state is rapidly established. This quasi-equilibrium ensemble spin state is stable for a time much longer than $T_1$.

The singlet population may be read out be adiabatic transport of the sample back into high field during the interval $\tau_{transp}^{(2)}$. This process breaks the symmetry of the sample and forms a sample which is an active NMR sample as illustrated at step S307 of FIG. 3.

Specifically, this process transforms the low-field singlet population into a population of the high-field $|\alpha\beta\rangle$ state, as depicted for time point 5 in FIG. 4c. The population of the $|\alpha\beta\rangle$ state is converted into observable NMR signals by the pulse sequence B at step S309 of FIG. 3.

Sequence B is given by three rf pulses separated by two unequal delays, and converts the $|\alpha\beta\rangle$ state population into antiphase NMR signals centered at the chemical shift $\delta_2$. NMR signals deriving from $T_1$ relaxation during the transport interval, on the other hand, only generate NMR signals at the chemical shift $\delta_1$. The interesting NMR signals derived from low-field singlet storage are therefore cleanly separated from signals with a trivial origin.

The pulse sequence $A_+$ is given by the two-pulse sequence $90_0$–$\tau_1$–$90_{-90}$, where the symbol $\beta_\phi$ denotes a strong, non-selective pulse with flip angle $\beta$ and phase $\phi$ (both angles are specified in degrees, and the phases taken into account the sign of the precession and the radio-frequency mixing scheme. The delay $\tau_1$ is set to the value $$\tau_1 = \left| \frac{\pi}{\omega_\Delta^{high}} \right|,$$

where $$\omega_\Delta^{high} = -\gamma \beta_{high}(\delta_2 - \delta_1) \qquad [10]$$

For the experimental results, the delay was set to the value $\tau_1 = 2.05$ ms.

Standard spin operator theory shows that in the case $\delta_2 > \delta_1$ and $\gamma > 0$, the pulse sequence $A_+$ has the approximate propagator $$U(A_+) = \exp\left\{-i\frac{\pi}{2}(I_{1Z} + I_{2Z})\right\}\exp\{+i\pi I_{2y}\} \qquad [11]$$

neglecting the effect of the J-coupling during the interval $\tau_1$. This assumption is valid in the case that the chemical shift frequency difference is much larger than the J-coupling (weak coupling approximation). The transformations of the individual state kets are $U(A_+)|\alpha\alpha\rangle = -|\alpha\beta\rangle$ $U(A_+)|\beta\alpha\rangle = -i|\alpha\alpha\rangle$ $U(A_+)|\alpha\beta\rangle = -i|\beta\beta\rangle$ $U(A_+)|\beta\beta\rangle = |\beta\alpha\rangle$ which leads to the exchanges of populations sketched in FIG. 3c. The population of the $|\alpha\beta\rangle$ state at time point 2 is derived from the thermal equilibrium population of the $|\alpha\alpha\rangle$ state.

The pulse sequence B is given by $90_0\tau_2$–$180_{90}$–$\tau_2$–$90_{45}$, with pulse sequence delays given by $$\tau_2 = \left|\frac{\pi}{(2\omega_\Delta^{high})}\right| + \left|\frac{1}{(4J)}\right| \text{ and } \tau_3 = \left|\frac{1}{(4J)}\right|.$$

For the experimental results, the delays were set to the values $\tau_2 = 44.64$ ms and $\tau_3 = 43.61$ ms. This sequence is designed to separate cleanly the interesting NMR signals deriving from the low-field singlet state from the uninteresting signals generated by relaxation of the spin system during the second transport interval.

From standard spin-operator theory, the propagator U(B) for this pulse sequence transforms the population operator of state $|\alpha\beta\rangle$ into a superposition of many operator terms, including some that represent antiphase single-quantum coherences:

$$U(B)I_1^\alpha I_2^\beta U(B)^\dagger = -\frac{1}{4}\exp\{-i\pi/4\}I_1^- I_2^\alpha - \frac{1}{4}\exp\{-i\pi/4\}I_1^\alpha I_2^- + \qquad [12]$$

$$\frac{1}{4}\exp\{-i\pi/4\}I_1^- I_2^\beta + \frac{1}{4}\exp\{-i\pi/4\}I_1^\beta I_2^- + \ldots$$

The (−1)-quantum coherences represented by operators $I_1^\alpha I_2^-$ and $I_1^\beta I_2^-$ generate the diagnostic antiphase signals near the chemical shift $\delta_2$.

Sequence B gives rise to no net signals at the chemical shift $\delta_2$ when applied to in-phase Zeeman magnetization, created by $T_1$ relaxation during the second transport interval $\tau_{ransp}^{(2)}$. This may be seen from the transformations $$U(B)I_{1z}U(B)^\dagger = -\frac{1}{2}\exp\{-i\pi/4\}I_1^+ I_2^\alpha - \qquad [13]$$

$$\frac{1}{2}\exp\{-i\pi/4\}I_1^- I_2^\alpha + \frac{1}{2}\exp\{-i\pi/4\}I_1^+ I_2^\beta + \frac{1}{2}\exp\{-i\pi/4\}I_1^- I_2^\beta$$

and $$U(B)I_{2z}U(B)^\dagger = -\frac{1}{2}I_1^+ I_2^+ + i\frac{1}{2}I_1^+ I_2^- - i\frac{1}{2}I_1^- I_2^+ + \frac{1}{2}I_1^- I_2^- \qquad [14]$$

Partially-relaxed Zeeman magnetization of spin $I_1$ only generates signals at the chemical shift $\delta_1$, while partially-relaxed Zeeman magnetization of spin $I_2$ only generates multiple-quantum coherences, which do not generate a signal at all. In principle, cross-correlated relaxation during the transport interval could also generate spurious signals at the shift $\delta_2$.

Figure 5:
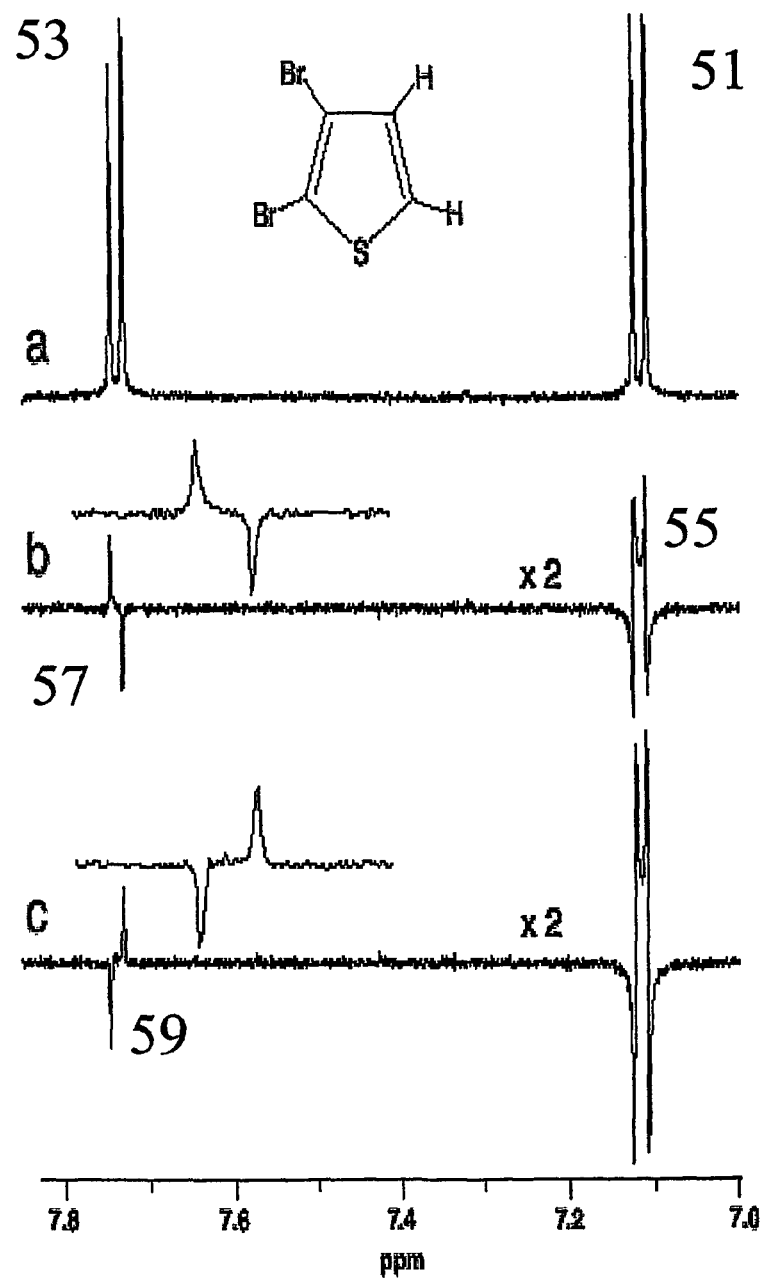

FIG. 5 illustrates NMR spectra for a sample of 500 microlitres of a 17.7 mM solution of 2,3-dibromothiophene in DMSO-d$^6$ at 20° C. The sample was contained in a 5 mm high-resolution NMR tube equipped with a Young valve to facilitate degassing. The sample contained a water impurity in approximately 27 mM concentration. The sample was subjected to three freeze-pump-thaw degassing cycles, each lasting over 30 minutes, to remove dissolved oxygen.

The NMR spectra illustrated in FIG. 5 were obtained using a Varian Infinity +400 MHz NMR system at a field of $B_{high} \approx 9.4$ T, using an actively shielded 89 mm bore magnet. A standard 5 mm high resolution NMR probe was used. The 90° pulse duration was around 5 μs.

The sample was transported between the high and the low fields using the standard pneumatic sample elevator. The pressure of the elevator was increased during the lift operation, and reduced during the insert operation in order to accelerate the transport times. Reproducible transport times of $\tau_{transp}^{(1)} = 9 \pm 1$s and $\tau_{transp}^{(2)} = 13 \pm 2$s measured from when the sample is fully loaded into the high field generating coil to when the sample is outside the magnet bore.

The field $B_{low}$ was estimate using a Hall-effect Gauss meter, with zero field calibrated to an accuracy of approximately 10 μT using a mu-metal shield far from the magnet.

For a low or storage field of $B_{low} = 20$ mT, the sample was elevated to the top of the magnet bore and allowed to remain there for the time $\tau_{LF}$. For even lower storage fields, the sample was carried physically to calibrated locations within the stray field of the magnet, or in the case $B_{low} = 0$, a magnetically shielded chamber.

In the above sample, the proton spin system is defined by $\delta_1 = 7.11$ ppm, $\delta_2 = 7.72$ ppm and J=5.7 Hz. FIG. 5a illustrates a conventional proton NMR spectrum, obtained at 400 MHz in the field of $B_{high} \approx 9.4$ T. The two doublets of a typical AX spin system 51, 53 are clearly visible.

A conventional inversion recovery series (not shown), demonstrates that the spin-lattice relaxation constants for the inequivalent sites are very similar in high field ($T_1(\delta_1) = 16.5 \pm 0.2$s; $T_1(\delta_2) = 17.1 \pm 0.2$s).

FIG. 5b is a plot of the NMR spectrum for the above sample after it has been subjected to the method described with reference to FIGS. 3 and 4. A quasi-equilibrium state was formed by subjected the sample to a high magnetic field and pulse sequence $A_+$, then transferring the sample adiabatically back to a low storage field. The spectrum in FIG. 3b was taken after the sample was maintained in a low field for a time $\tau_{LF}$ of 100s (i.e. much longer than $T_1$ for either $\delta_1$ or $\delta_2$). The spectrum of FIG. 5b shows diagnostic antiphase signals 55 at around $\delta_2$=7.72 ppm, and an antiphase dispersion structure 57 around $\delta_1$=7.11 ppm. Both of these structures are due to the creation of the quasi-equilibrium state in the preparation of the sample.

The inset of FIG. 5b shows the region from 7.76 to 7.68 expanded.

The quasi-equilibrium state in the sample is created by manipulating the spins using pulse sequence $A_+$ as previously described. To prove that the creation of the singlet state is responsible for the features which exist long after $T_1$, a second experiment was performed.

The second experiment was performed in the same manner as the first experiment, but used the pulse sequence A instead of the pulse sequence $A_+$. Pulse sequence A is derived from $A_+$ by changing one of the pulse phases. This exchanges the population of state $|\alpha\beta\rangle$ with that of $|\beta\beta\rangle$ instead of with $|\alpha\alpha\rangle$. The population of $|\alpha\beta\rangle$ is therefore depleted at time point 2 as opposed to enhanced.

In detail, pulse sequence A is given by two pulse sequences $90_{180}-\tau_1-90_{-90}$. The sequence differs from $A_+$ by a 180° phase shift of the first pulse. The spin propagator for this sequence, under the weak coupling approximation, is:

$$U(A_-) = \exp\{-i\frac{\pi}{2}(I_{1z} + I_{2z})\}\exp\{+i\pi I_{1y}\} \quad [15]$$

which leads to the following ket transformations:

$U(A_-)|\alpha\alpha\rangle=-|\alpha\beta\rangle$ $U(A_-)|\beta\alpha\rangle=i|\beta\beta\rangle$ $U(A_-)|\alpha\beta\rangle=i|\alpha\alpha\rangle$ $U(A_-)|\beta\beta\rangle=|\beta\alpha\rangle$ The population of the $|\alpha\beta\rangle$ state at time point 2 is derived from the thermal equilibrium population of the $|\alpha\alpha\rangle$ state.

Since the $|\alpha\beta\rangle$ state is connected adiabatically to the low field singlet, the sequence A as well as $A_+$ can be used to prepare a low field singlet. However, the population of the low field singlet deviates from the mean in opposite senses for the states formed using $A_+$ and $A_-$. This variation from the mean in opposite senses means that the diagnostic antiphase signals 55 will change sign.

Thus, in FIG. 5c, the diagnostic antiphase signals 59 at $\delta_2$=7.72 ppm have a change in sign from the equivalent signals 57 in FIG. 2b. The signals around $\delta_1$=7.11 ppm are also perturbed, but in more complicated way since these signals are superpositions of several contributions.

Since the total interval $\tau_{transp}^{(1)}+\tau_{LF}+\tau_{transp}^{(2)}=120s$ exceeds $T_1$ by a factor of seven, the spectra of FIGS. 5b and 5c prove that the memory of the nuclear spin system has been extended significantly beyond the $T_1$ limit.

Figure 6:
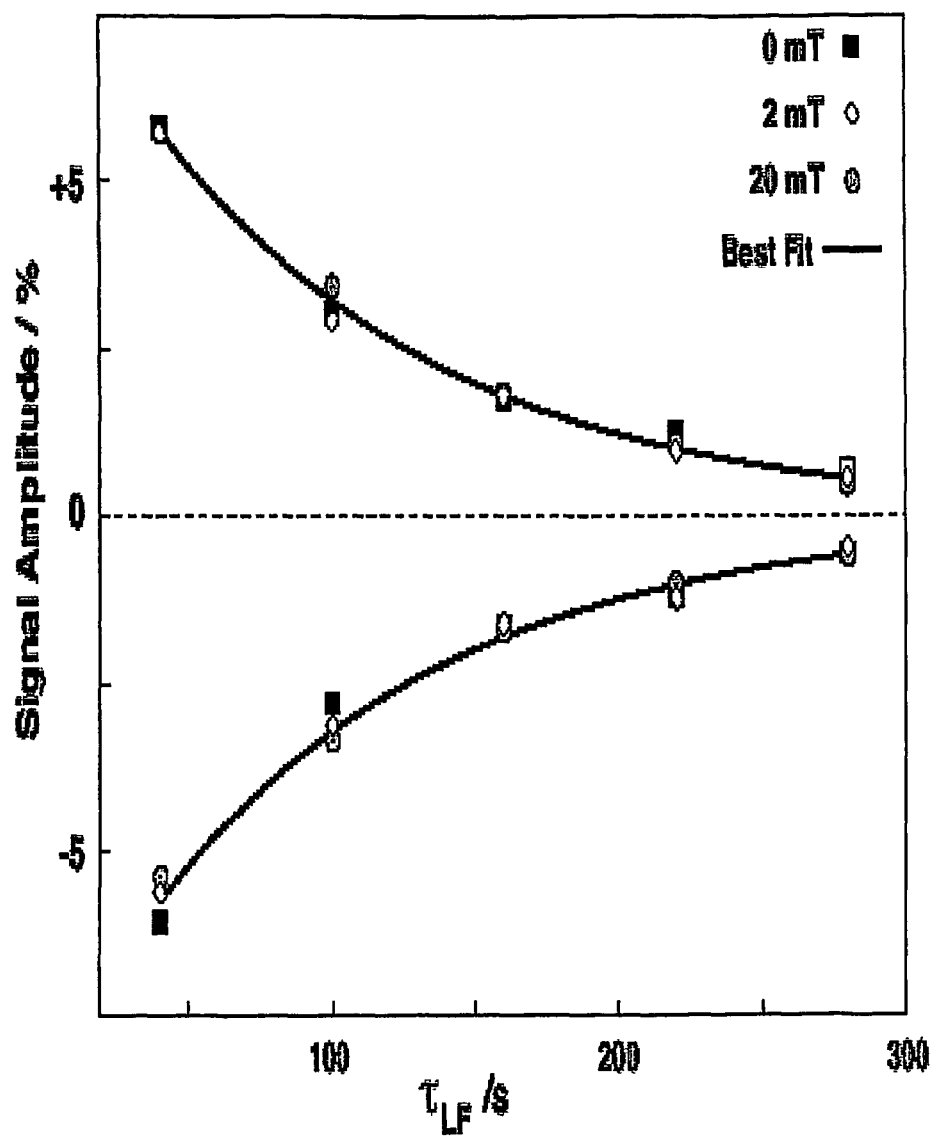
FIG. 6 schematically illustrates a plot of signal amplitude against time when the sample is placed in a low field condition.
Figure 7:
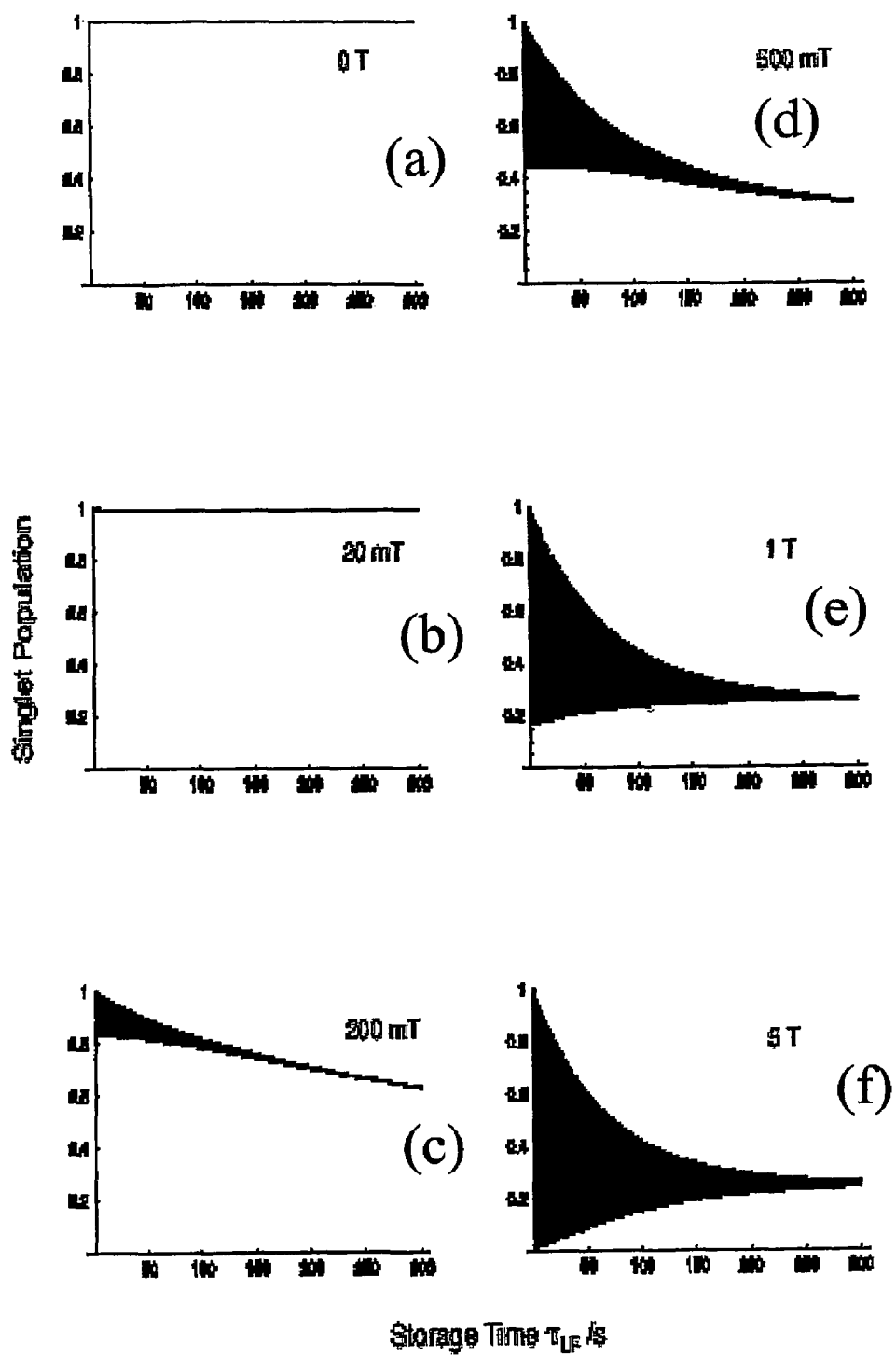

FIG. 6 is a plot of the amplitude of the 7.72 ppm antiphase signals against as function of $\tau_{LF}$ for storage magnetic field strengths of 0 T, 2 mT and 20 mT. The amplitude of the 7.72 ppm antiphase signal is related to the singlet population.

In a storage field of $B_{low}$=1.8±0.5 mT, the time constant for the quasi-equilibrium decay is estimated to be $T_{qe}$=104±5s.

The quasi-equilibrium decay time constant had no appreciable field dependence for magnetic fields less than $B_{low}$=20 mT. The effect of higher magnetic fields on the population of the singlet state will be described with reference to FIG. 5.

The quasi-equilibrium decay is observed to accelerate when the proton concentration in the solution is increased. This indicates that intermolecular proton-proton relaxation is a strong contributor to the quasi-equilibrium relaxation, and that highly dilute solutions are advantageous to achieve long lifetimes. Quasi-equilibrium relaxation may also be caused by paramagnetic impurities such as dissolved oxygen, intermolecular interactions with solvent deuterons, and scalar relaxation of the second kind via the Br nuclei.

FIGS. 7a to 7f are plots of simulations of the singlet state population as a function of time for a plurality of different fields. In FIG. 7a $B_{low}$=0 T, FIG. 7b $B_{low}$=20 mT, FIG. 7c $B_{low}$=200 mT, FIG. 5d $B_{low}$=500 mT, FIG. 5e $B_{low}$=1 T and FIG. 5f $B_{low}$=5 T.

The trajectory of the singlet population in a magnetic field is predicted using the Liouville-von Neumann equation [4]. For 2,3-dibromothiophene, the distance between proton nuclei was estimated to be r=253 pm. The spin-lattice relaxation in high field was assumed to be dominated by intramolecular dipole-dipole relaxation, modelled as the isotropic rotational diffusion of a rigid molecule. With this model, the observed $T_1$ value of 20s corresponds to a rotational correlation time of $T_c$=15 ps.

At low values of $B_{low}$, the singlet state population is predicted to be time independent over a timescale of hundreds of seconds as seen in FIGS. 7a and 7b. As the storage field is increased beyond around 200 mT, a rapid low amplitude oscillation of the singlet state population is imposed on a slower decay as can be seen in FIGS. 7c and 7d. Finally, a higher fields, the amplitude of the oscillations becomes very large and at long times the population equilibrates among the four available states, indicating loss of all spin order as can be seen in FIGS. 7e and 7f.

The experimental results show a significant damping of the quasi-equilibrium spin order on the timescale of 100s for fields much less than 200 mT. This indicates the participation of relaxation mechanisms other than intramolecular dipole-dipole coupling. Intermolecular dipole-dipole relaxation involving water protons or protons on different DBT molecules is likely to be the major quasi-equilibrium damping mechanism.

In the method described with reference to FIGS. 3 and 4, symmetry operations are imposed on or removed from the Hamiltonian by moving the sample from a high to a low magnetic field. However, other options are possible.

Figure 8:
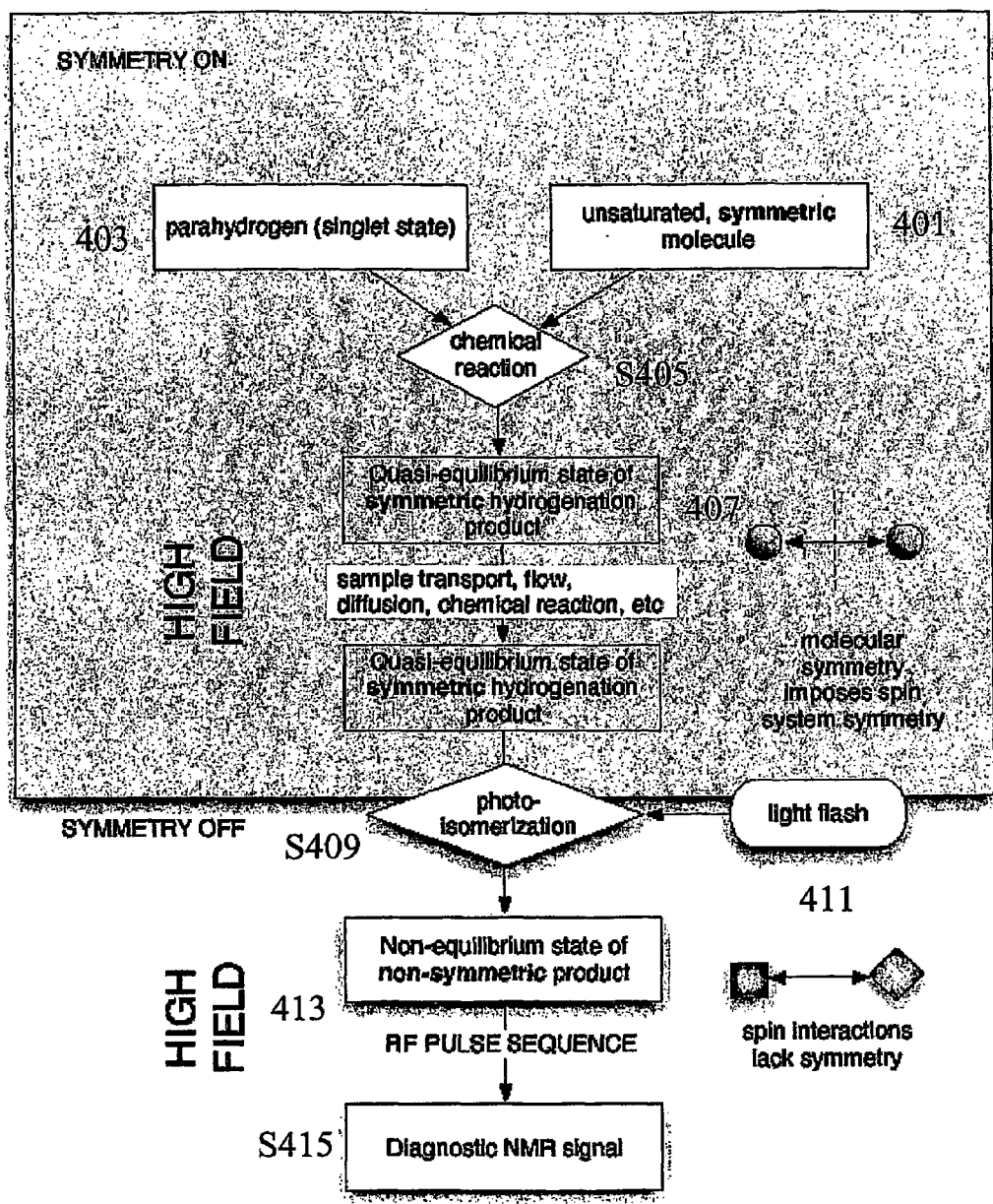
FIG. 8 is a flow diagram schematically illustrating a method in accordance with a further embodiment of the present invention.
Figure 9:
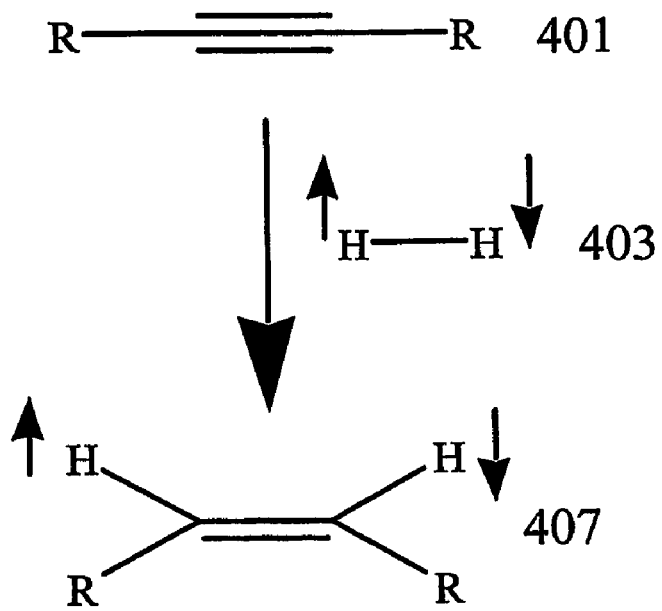
FIG. 9 is a diagram schematically illustrating a chemical reaction of a symmetric molecule with parahydrogen.

FIG. 8 is a flow diagram for performing a method in accordance with an embodiment of the present invention where the sample 401 is inherently symmetric in both a high or a low magnetic field. An example of such a sample 401 is shown in FIG. 9.

A quasi equilibrium nuclear spin ensemble state may be formed by reacting a sample with parahydrogen in a high field environment, the "Pasadena" effect (Russell Bowers et al. J. Am Chem. Soc, 109 5541-5542 (1987)), or in a low field environment, the "Altadena" effect (Pravica et al, Chemical Physics Letters, 145, 255-258 (1988)).

The symmetric sample 401 is reacted with parahydrogen 403 the presence of a catalyst at step S405. This reaction is shown schematically in FIG. 9. Parahydrogen is a form of hydrogen gas in which the hydrogen nuclei are in the nuclear spin singlet state. In FIG. 9, R refers to identical chemical groups. A sample having a quasi equilibrium nuclear spin ensemble state is produced 407.

The sample with the quasi equilibrium nuclear spin ensemble state 407 may then be subjected to processes for a time exceeding $3T_1$ as explained in relation to FIG. 1.

To break the symmetry of the sample and thus to allow an NMR signal to be observed, the sample is subjected to a photoisomerization process in step S409 by briefly illuminating the sample with light flash 411.

A non-equilibrium state of a non-symmetric product 413 is produced as a result of the photoisomerization process and the sample is investigated using NMR techniques in step S415.

In the above described method, the sample is kept in a high field environment all the time and symmetry is switched on an off using either a chemical reaction or photoisomerization.

Figure 10:
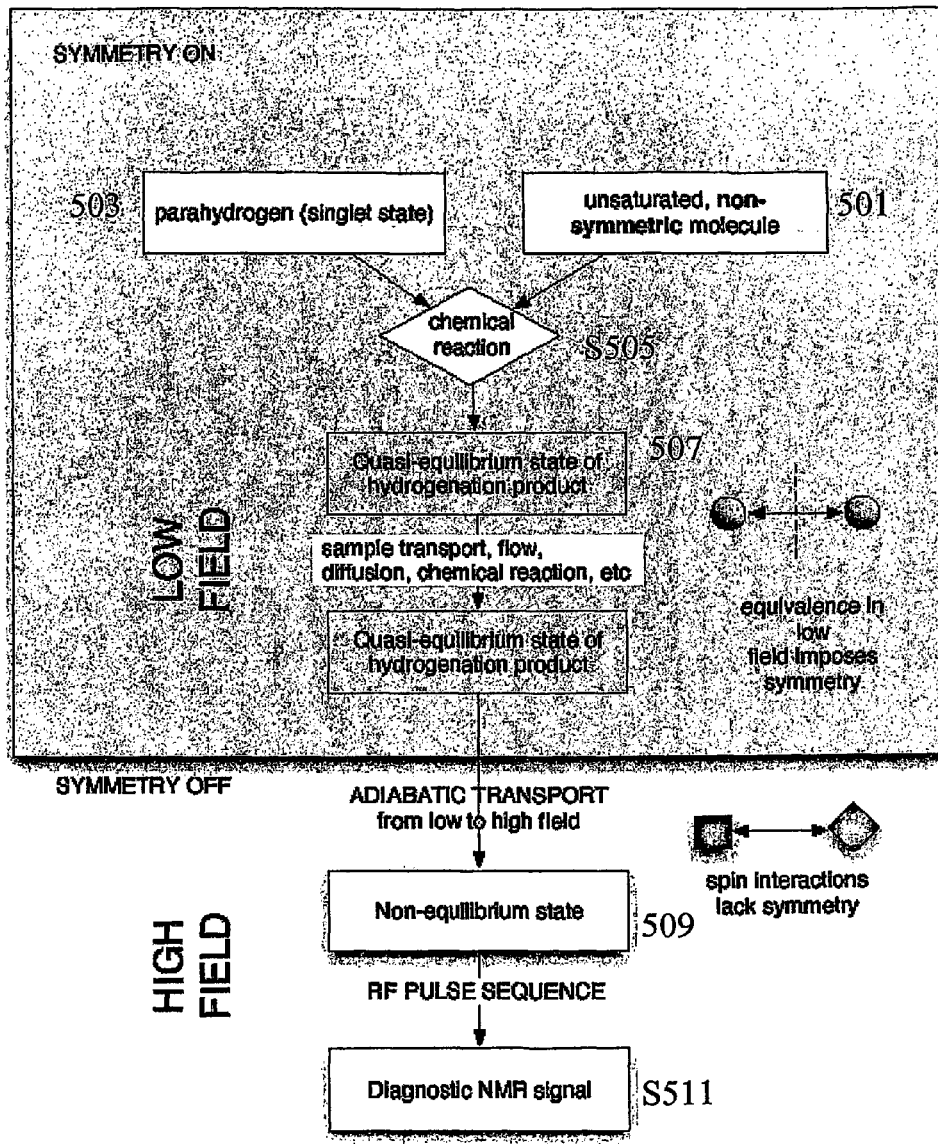
FIG. 10 is a flow diagram schematically illustrating a method in accordance with a further embodiment of the present invention.

FIG. 10 schematically illustrates a variation on the method described with reference to FIG. 8. Here, the starting sample 501 is an unsaturated non-symmetric molecule 501. An example of molecule 501 is shown in FIG. 11.

Molecule 501 is reacted with parahydrogen 503 in step S505 in the presence of a catalyst and in a low field environment to produce a sample 507 having a quasi equilibrium nuclear spin ensemble state. A quasi equilibrium nuclear spin ensemble state may be formed by introducing a sample to parahydrogen in a low field environment, the "Altadena" effect (Pravica et al, Chemical Physics Letters, 145, 255 to 258 (1988)).

Figure 11:
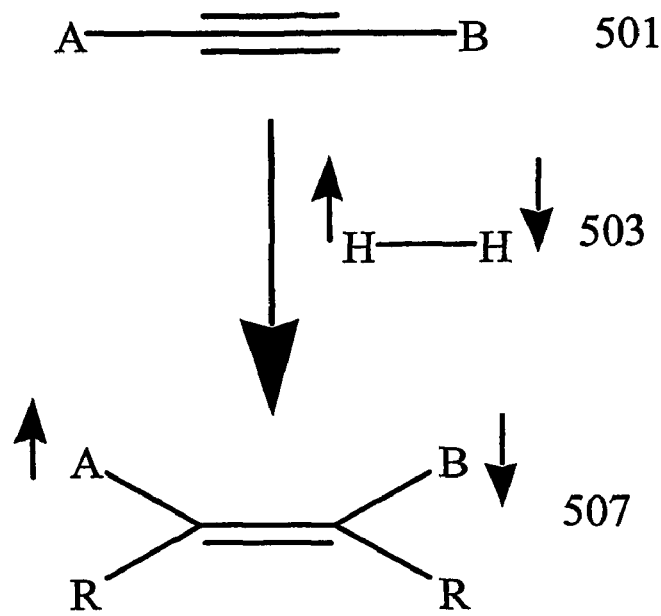
FIG. 11 is a diagram schematically illustrating a chemical reaction of a non-symmetric molecule with parahydrogen.

In FIGS. 11, A and B refer to non-identical chemical groups. In this case, a quasi equilibrium nuclear spin ensemble state is only produced if the external magnetic field is low enough that the chemical shift difference between the two hydrogen nuclei is negligible.

The symmetry is then broken by transferring the sample to a high field to produce non-equilibrium state 509. An NMR signal may then be detected in step S511.

Figure 12:
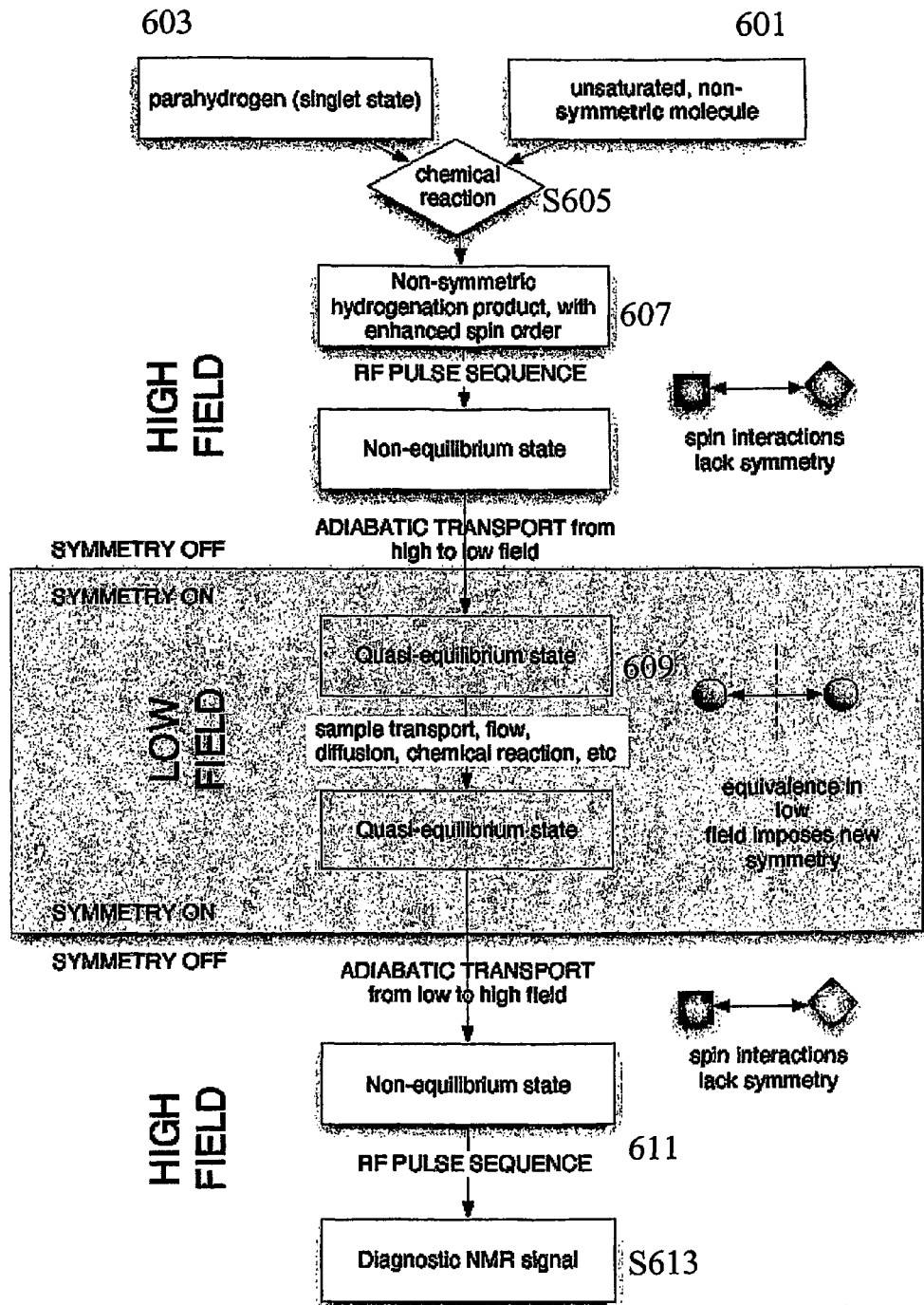
FIG. 12 is a flow diagram schematically illustrating a method in accordance with a further embodiment of the present invention.

The flow chart of FIG. 12 schematically illustrates a variation of the method of FIG. 10. In the same manner as FIG. 10, unsaturated non-symmetric molecule 601 is reacted with parahydrogen 603 in step S605 in the presence of a catalyst and in a high field environment to produce a sample 607 which is a non-symmetric hydrogenation product with enhanced spin order.

Next, a symmetry operation is imposed on the Hamiltonian of product 607 by transferring the sample adiabatically to a low field environment to form the quasi equilibrium nuclear spin ensemble state 609.

Once the sample 609 has been subjected to the desired processes, symmetry is broken by transferring the sample to a high field to produce NMR active sample 611 which can be measured in step S613.

As previously mentioned, symmetry operations may be imposed on or removed from the Hamiltonian using photoisomerization.

Chemical reactions, such as photoisomerization, may switch the molecules between different conformational or configurational states, in which spin symmetry operations are either imposed or removed. As an example, consider the molecule shown in FIG. 13a. The two central $CH_2$ groups are chemically equivalent, since the molecule has a mirror plane of symmetry. However, the double bonds are readily photoisomerized, giving the mixed cis-trans form shown in FIG. 13b.

The two central $CH_2$ groups are now chemically inequivalent, since one has a cis ligand, while the other has a trans ligand. A further photoisomerization step generates the all-cis form, in which the two central $CH_2$ groups are chemically equivalent again:

Thus, a light flash 701 may therefore be used to switch the symmetry of the spin Hamiltonian.

Figure 14:
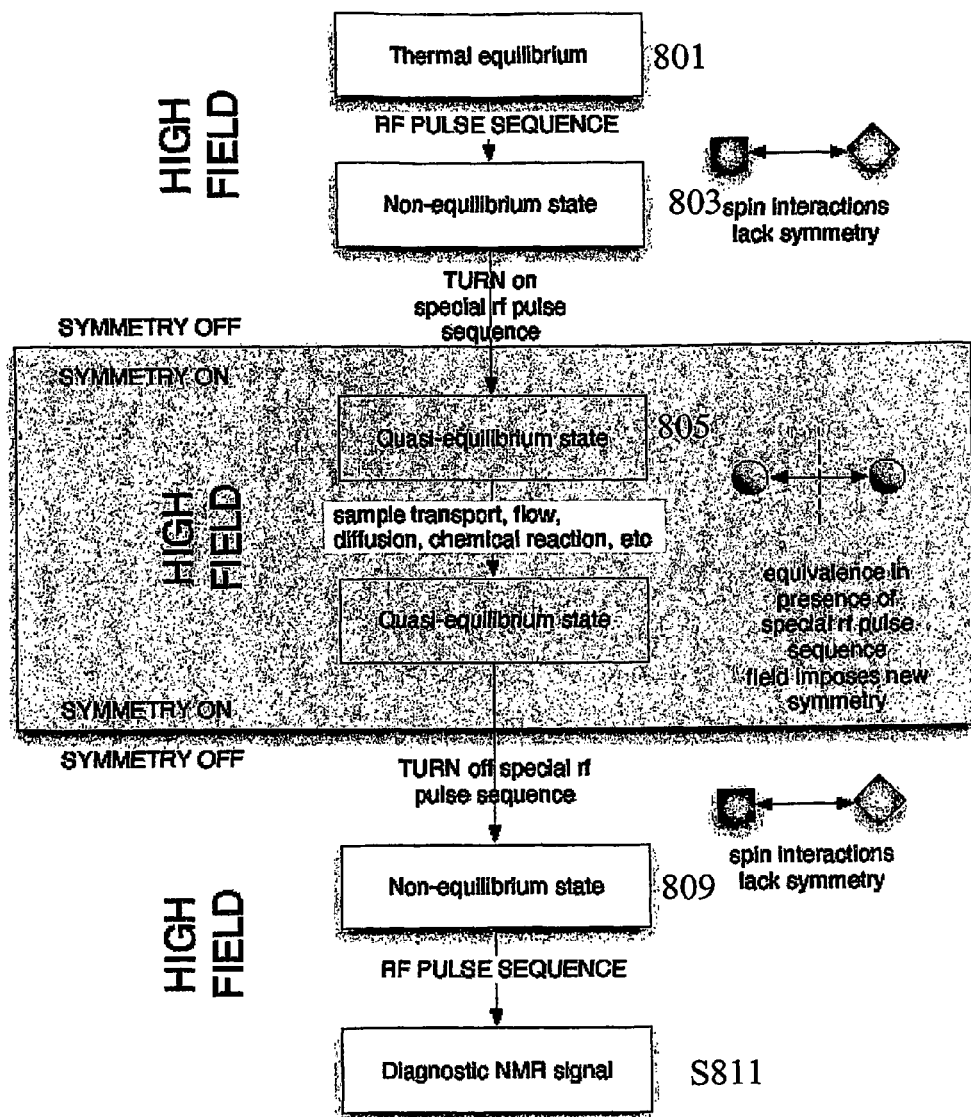
FIG. 14 is a flow diagram schematically illustrating a method in accordance with a further embodiment of the present invention.

The flow chart of FIG. 14 illustrates a further method in accordance with an embodiment of the present invention. As in the case of the method described with reference to FIG. 3, the sample is not symmetric when in thermal equilibrium in a high field environment 801.

A first RF pulse sequence is applied to the sample in a high field in order to create a non-equilibrium state 803.

As before, the symmetry of the sample is removed, and due to the populations of non-equilibrium state 803, a quasi equilibrium nuclear spin ensemble state 805 is formed. where the sample 401 is inherently symmetric in both a high or a low magnetic field. An example of such a sample 401 is shown in FIG. 9.

In this case, the chemical shift differences between the nuclear spins are removed and symmetry is achieved by applying a special radiofrequency pulse sequence, a second rf pulse sequence, rather than transporting the sample into a low magnetic field. Radiofrequency pulse sequences with the appropriate properties are commonly used for heteronuclear spin decoupling in solution NMR (see for example, M. H. Levitt, R. Freeman and T. A. Frenkiel, Adv. Magn. Reson. 11, 47 (1983)).

The sample with the quasi equilibrium nuclear spin ensemble state 805 may then be subjected to processes for a time exceeding $3T_1$ as explained in relation to FIG. 1. Throughout this time, symmetry is maintained by the second rf pulse sequence which is continually applied to the sample. The sample is kept in a high field environment.

To break the symmetry of the sample and thus to allow an NMR signal to be observed, the second rf pulse sequence is removed.

A non-equilibrium state of a non-symmetric product 809 is produced as a result of removing the second rf pulse sequence. The sample is investigated using NMR techniques in step S811.

The invention claimed is:

1. A nuclear magnetic resonance method, the method comprising:
    providing a sample where the nuclear spin Hamiltonian operator of the component molecules of the sample possess one or more symmetry operations;
    creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations;
    allowing said quasi equilibrium nuclear spin ensemble state to remain for a time of equal to or substantially greater than $3T_1$, where $T_1$ is the spin lattice relaxation time;
    breaking at least one symmetry operation of said Hamiltonian;
    applying a sequence of magnetic fields to generate a nuclear magnetic resonance signal from said sample; and
    detecting said nuclear magnetic resonance signal.

2. A method according to claim 1, wherein said quasi equilibrium nuclear spin ensemble state created is a singlet state population.

3. A method according to claim 1, wherein said quasi equilibrium nuclear spin ensemble state created is a not a singlet state population.

4. A method according to claim 1, wherein providing a sample where the nuclear spin Hamiltonian operator of the component molecules of the sample possess one or more symmetry operations comprises reducing the magnetic field to a value where a symmetry operation is imposed on the Hamiltonian.

5. A method according to claim 1, wherein providing a sample where the nuclear spin Hamiltonian operator of the component molecules of the sample possess one or more symmetry operations comprises applying a radiofrequency pulse sequence to eliminate chemical shift differences.

6. A method according to claim 1, wherein providing a sample where the nuclear spin Hamiltonian operator of the component molecules of the sample possess one or more symmetry operations comprises subjecting the sample to a chemical reaction configured to switch the molecules of the sample between different conformational or configurational states.

7. A method according to claim 6, wherein said chemical reaction is a photoisomerization reaction.

8. A method according to claim 7, wherein said photoisomerization reaction is configured to switch a molecule from a mixed cis-trans form to a pure cis form or trans form.

9. A method according to claim 1, wherein creating said quasi equilibrium nuclear spin ensemble state comprises subjecting the sample to radiofrequency pulses of a magnetic field in a high magnetic field environment.

10. A method according to claim 1, wherein creating said quasi equilibrium nuclear spin ensemble state comprises reacting an unsaturated symmetric molecule with parahydrogen.

11. A method according to claim 1, wherein creating said quasi equilibrium nuclear spin ensemble state comprises reacting an unsaturated non-symmetric molecule with parahydrogen and providing the product of the reaction in a low magnetic field.

12. A method according to claim 1, wherein said sample with said quasi equilibrium nuclear spin ensemble state flows through an apparatus or a body.

13. A method according to claim 1, wherein said sample with said quasi equilibrium nuclear spin ensemble state is reacted with a second sample.

14. A method according to claim 1, wherein said sample with said quasi equilibrium nuclear spin ensemble state is purified.

15. A method according to claim 1, wherein said sample with said quasi equilibrium nuclear spin ensemble state is placed in contact with a second sample.

16. A method according to claim 1, breaking said symmetry comprises transporting said sample into a high magnetic field.

17. A method according to claim 1, wherein breaking said symmetry comprises reacting said sample with a further chemical.

18. A method according to claim 1, wherein breaking said symmetry comprises subjecting said sample to a photochemical reaction.

19. A method according to claim 1, wherein breaking said symmetry comprises terminating an application of a pulse sequence designed to suppress chemical shift differences.

20. A method according to claim 1, wherein electromagnetic induction is used to detect said nuclear magnetic resonance signal.

21. A method according to claim 1, wherein the B field from the magnetic nuclei is directly detected.

22. A nuclear magnetic resonance method, the method comprising:

providing a sample where the nuclear spin Hamiltonian operator of the component molecules of the sample possess one or more symmetry operations;

creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population;

breaking the symmetry operation of said Hamiltonian;

applying a sequence of magnetic fields to generate a nuclear magnetic resonance signal from said sample; and detecting said nuclear magnetic resonance signal.

23. A method according to claim 22, further comprising allowing said quasi equilibrium nuclear spin ensemble state to remain for a time of equal to or substantially greater than $3T_1$, where $T_1$ is the spin lattice relaxation time before breaking at least one symmetry operation of said Hamiltonian.

24. A nuclear magnetic resonance apparatus, the apparatus comprising:

means for providing a sample where the nuclear spin Hamiltonian operator of the component molecules of the sample possess one or more symmetry operations;

means for creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population;

means for breaking the symmetry operation of said Hamiltonian;

means for applying a sequence of magnetic fields to generate a nuclear magnetic resonance signal from said sample; and means for detecting said nuclear magnetic resonance signal.

25. A method of storing information, said method comprising:

providing a sample where the nuclear spin Hamiltonian operator of the component molecules of the sample possess one or more symmetry operations;

creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations; and assigning a bit value to at least one spin state of said quasi equilibrium nuclear spin ensemble state and storing said spin state for a time equal to or substantially greater than $3T_1$, where $T_1$ is the spin lattice relaxation time.

26. A method of storing information, said method comprising:

providing a sample where the nuclear spin Hamiltonian operator of the component molecules of the sample possess one or more symmetry operations;

creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population; and assigning a bit value to at least one spin state of said quasi equilibrium nuclear spin ensemble state and storing said spin state for a time equal to or substantially greater than $3T_1$, where $T_1$ is the spin lattice relaxation time.

27. An apparatus for storing information, said apparatus comprising:

means for providing a sample where the nuclear spin Hamiltonian operator of the component molecules of the sample possess one or more symmetry operations;

means for creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations; and means for assigning a bit value to at least one spin state of said quasi equilibrium nuclear spin ensemble state and storing said spin state for a time equal to or substantially greater than $3T_1$, where $T_1$ is the spin lattice relaxation time.

28. An apparatus for storing information, said apparatus comprising:

means for providing a sample where the nuclear spin Hamiltonian operator of the component molecules of the sample possess one or more symmetry operations;

means for creating a quasi equilibrium nuclear spin ensemble state in a sample, said quasi equilibrium nuclear spin ensemble state comprising at least two manifolds of spin states which transform differently under said symmetry operations of said Hamiltonian and said manifolds having different mean nuclear spin populations, said quasi equilibrium nuclear spin ensemble state not having a singlet state population; and means for assigning a bit value to at least one spin state of said quasi equilibrium nuclear spin ensemble state.

* * * * *